(12) United States Patent
Kim et al.

(10) Patent No.: US 9,159,730 B2
(45) Date of Patent: Oct. 13, 2015

(54) METHODS FOR FABRICATING A SEMICONDUCTOR DEVICE

(71) Applicant: SAMSUNG ELECTRONICS CO., LTD., Suwon-si, Gyeonggi-do (KR)

(72) Inventors: Dae-Ik Kim, Hwaseong-si (KR); Ho-In Ryu, Suwon-si (KR); Nak-Jin Son, Suwon-si (KR); Yoo-Sang Hwang, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 21 days.

(21) Appl. No.: 14/097,786

(22) Filed: Dec. 5, 2013

(65) Prior Publication Data
US 2014/0154882 A1   Jun. 5, 2014

(30) Foreign Application Priority Data
Dec. 5, 2012  (KR) .................. 10-2012-0140329

(51) Int. Cl.
*H01L 21/8242* (2006.01)
*H01L 27/108* (2006.01)

(52) U.S. Cl.
CPC .... *H01L 27/10855* (2013.01); *H01L 27/10876* (2013.01); *H01L 27/10885* (2013.01); *H01L 27/10888* (2013.01)

(58) Field of Classification Search
CPC ............ H01L 29/66621; H01L 27/11578; H01L 27/11531; H01L 27/0203
USPC .................................................. 438/244, 430
See application file for complete search history.

(56) References Cited

U.S. PATENT DOCUMENTS

| | | | |
|---|---|---|---|
| 5,783,462 A | 7/1998 | Huang | |
| 2010/0140676 A1 | 6/2010 | Yeom | |
| 2010/0330793 A1 | 12/2010 | Kim | |
| 2011/0169174 A1 | 7/2011 | Kim | |
| 2011/0221010 A1 | 9/2011 | Baek et al. | |
| 2013/0193549 A1* | 8/2013 | Lee | 257/508 |

FOREIGN PATENT DOCUMENTS

| | | | |
|---|---|---|---|
| KR | 10-2008-0099482 A | 11/2008 | |
| KR | 10-2011-0001722 A | 1/2011 | |
| KR | 10-2011-0008477 A | 1/2011 | |
| KR | 10-2011-0047882 A | 5/2011 | |

* cited by examiner

*Primary Examiner* — Caridad Everhart
(74) *Attorney, Agent, or Firm* — Lee & Morse, P.C.

(57) ABSTRACT

A method for fabricating a semiconductor device includes forming a device isolation layer pattern on a substrate to form an active region, the active region including a first contact forming region at a center p of the active region and second and third contact forming regions at edges of the active region, forming an insulating layer and a first conductive layer on the substrate, forming a mask pattern having an isolated shape on the first conductive layer, etching the first conductive layer and the insulating layer to expose the active region of the first contact forming region by using the mask pattern, to form an opening portion between pillar structures, forming a second conductive layer in the opening, and patterning the second conductive layer and the first preliminary conductive layer pattern to form a wiring structure contacting the first contact forming region and having an extended line shape.

20 Claims, 30 Drawing Sheets

THIRD DIRECTION
↑
↙ FIRST DIRECTION
→ SECOND DIRECTION

METHODS FOR FABRICATING A SEMICONDUCTOR DEVICE

CROSS-REFERENCE TO RELATED APPLICATION

Korean Patent Application No. 10-2012-0140329, filed on Dec. 5, 2012, in the Korean Intellectual Property Office, and entitled: "Methods for Fabricating A Semiconductor Device," is incorporated by reference herein in its entirety.

BACKGROUND

1. Field

Example embodiments relate to methods for fabricating a semiconductor device. More particularly, example embodiments relate to methods for fabricating a highly integrated DRAM device.

2. Description of the Related Art

Recently, semiconductor devices including DRAM devices are highly integrated. According to the increase of an integration degree, the contacting area of a contact may be decreased and a contact resistance may be increased. In addition, bridge defects between the contact and an adjacent pattern or bridge defects between the contact and an adjacent active region are increasing.

SUMMARY

Example embodiments provide a method for fabricating a semiconductor device including a minute wiring structure.

According to example embodiments, there is provided a method for fabricating a semiconductor device. The method includes forming a device isolation layer pattern on a substrate to form an active region having an isolated shape. The active region includes a first contact forming region at an upper portion of a center portion of the active region and second and third contact forming regions at upper portions of both edge portions of the active region. An insulating layer is formed on the substrate, and a first conductive layer is formed on the insulating layer. A mask pattern having an isolated shape is formed on the first conductive layer. The mask pattern defines portions of the second and third contact forming regions and a portion of the device isolation layer pattern adjacent to the second and third contact forming regions. The first conductive layer and the insulating layer are etched to expose the active region of the first contact forming region by using the mask pattern, to form a structure including a first preliminary conductive pattern and an insulating layer pattern and having a pillar shape covering the second contact forming region and to form an opening portion between the structures. A second conductive layer is formed on the first preliminary conductive layer pattern. The second conductive layer fills up an inner portion of the opening portion. The second conductive layer and the first preliminary conductive layer pattern are patterned to form a wiring structure contacting the first contact forming region and having an extended line shape.

In example embodiments, the mask pattern may be formed to have a shape covering the second contact forming region of one active region and the third contact forming region in an adjacent another active region.

In example embodiments, the first preliminary conductive layer pattern may be formed so that a minimum width of the opening portion exposing the first contact forming region may be greater than a maximum width of the first contact forming region.

In example embodiments, the second conductive layer formed in the opening portion may have a connected shape covering the first contact forming region. The second conductive layer may exclude an isolated shape.

In example embodiments, a line width of the wiring structure may be smaller than a minimum width of the opening portion of a portion exposing the first contact forming region.

In example embodiments, the substrate in the exposed active region may be additionally etched so that the active region at a bottom portion of the opening portion has a lower upper surface than another active regions, during conducting an etching process with respect to the first conductive layer and the insulating layer to expose the active region of the first contact forming region.

In example embodiments, the mask pattern may be formed as a photoresist pattern through a photo process.

In example embodiments, the forming of the mask pattern may include forming a mask layer on the first conductive layer, and forming a first preliminary mask pattern including a first preliminary opening portion selectively exposing an upper portion of the first contact forming region. The first preliminary mask pattern may be formed on the mask layer. A buried layer burying the first preliminary opening portion of the first preliminary mask pattern may be formed, and a second preliminary mask pattern including a second preliminary opening portion may be formed by removing the first preliminary mask pattern between the buried layers. A mask pattern may be formed by etching the mask layer using the second preliminary mask pattern as an etching mask.

In example embodiments, the method may further include forming a buried gate structure at the substrate of the active region and the device isolation layer pattern. The buried gate structure may have a line shape extended to a vertical direction of the wiring structure.

In example embodiments, the method may further include after forming the wiring structure, forming an insulating interlayer covering the wiring structure, and forming a second contact and a third contact through the insulating interlayer. The second contact and the third contact may contact the active regions of the second and third contact forming regions.

In example embodiments, the active regions may extend in a first direction, the active regions being parallel to each other and spaced apart from each other in a second direction. The wire structure may extend the second direction, the first direction being diagonal to an extended direction of the second direction. The second contact forming region of one active region is adjacent to the third contact forming region of an adjacent active region.

In example embodiments, the forming of the second conductive layer may include forming a polysilicon layer on the first preliminary conductive layer pattern. The polysilicon layer may fill up an inner portion of the opening portion. The polysilicon layer may be planarized to form a preliminary polysilicon pattern in the inner portion of the opening portion. A barrier metal layer and a metal layer may be formed on the preliminary polysilicon pattern and the first preliminary conductive layer pattern.

In example embodiments, the forming of the wiring structure by patterning the second conductive layer and the first preliminary conductive layer pattern may include forming a hard mask pattern having a line shape on the metal layer, and etching the metal layer, the barrier metal layer and the polysilicon layer by using the hard mask pattern.

In example embodiments, the first conductive layer may include polysilicon.

According to example embodiments, there is provided a method for fabricating a semiconductor device. A device isolation layer pattern is formed on a substrate to form an active region having an isolated shape. The active region includes a first contact forming region at an upper portion of a center portion of the active region and second and third contact forming regions at upper portions of both edge portions of the active region. An insulating layer is formed on the active region and a mask pattern having an isolated shape is formed on the insulating layer. The mask pattern defines portions of the second and third contact forming regions and an upper portion of the device isolation layer pattern adjacent to the second and third contact forming regions. The insulating layer is etched to expose the active region of the first contact forming region by using the mask pattern, to form an insulating layer pattern having a pillar shape covering the second contact forming region and to form an opening portion between the structures. A conductive layer is formed on the insulating layer pattern. The conductive layer fills up an inner portion of the opening portion. The conductive layer is patterned to form a wiring structure making contact with the first contact forming region. The wiring structure has an extended line shape.

According to example embodiments, there is provided a method for fabricating a semiconductor device. A method for fabricating a semiconductor device includes forming a device isolation layer pattern on a substrate to define an active region with an isolated shape, the active region including a first contact forming region at a center of the active region and second and third contact forming regions at respective edges of the active region, forming an insulating layer on the substrate, forming a first conductive layer on the insulating layer, forming a mask pattern on the first conductive layer, the mask pattern defining portions of the second and third contact forming regions and a portion of the device isolation layer pattern adjacent to the second and third contact forming regions, etching the first conductive layer and the insulating layer through the mask pattern, such that the first contact forming region in the active region is exposed through an opening and pillar structures are defined on the second and third contact forming regions of the active region, the pillar structures including a first preliminary conductive pattern and an insulating layer pattern, and the opening being defined between adjacent pillar structures, forming a second conductive layer on the first contact forming region in the active region, such that the opening between the pillar structures is filled with the second conductive layer, and patterning the second conductive layer, such that the second conductive layer and the first preliminary conductive layer pattern have a level upper surface and define a wiring structure contacting the first contact forming region.

Forming the second conductive layer may include forming a continuous layer contacting simultaneously the first contact forming region in a plurality of active regions.

Patterning the second conductive layer may include forming the wiring structure to have a line shape, an upper surface of the line shape being continuous and contacting a plurality of active regions.

Etching the first conductive layer and the insulating layer to form the opening may include forming an opening that extends to overlap a plurality of active regions.

The opening may not be an isolated shape.

BRIEF DESCRIPTION OF THE DRAWINGS

Example embodiments will be more clearly understood from the following detailed description taken in conjunction with the accompanying drawings.

FIGS. 1 to 7 represent non-limiting, example embodiments as described herein.

FIG. 5 illustrates a plan view corresponding to the cross-sectional view in FIG. 4B.

FIG. 7 illustrates a block diagram of a schematic constitution of a computing system in accordance with example embodiments.

DETAILED DESCRIPTION

Figure 1A:
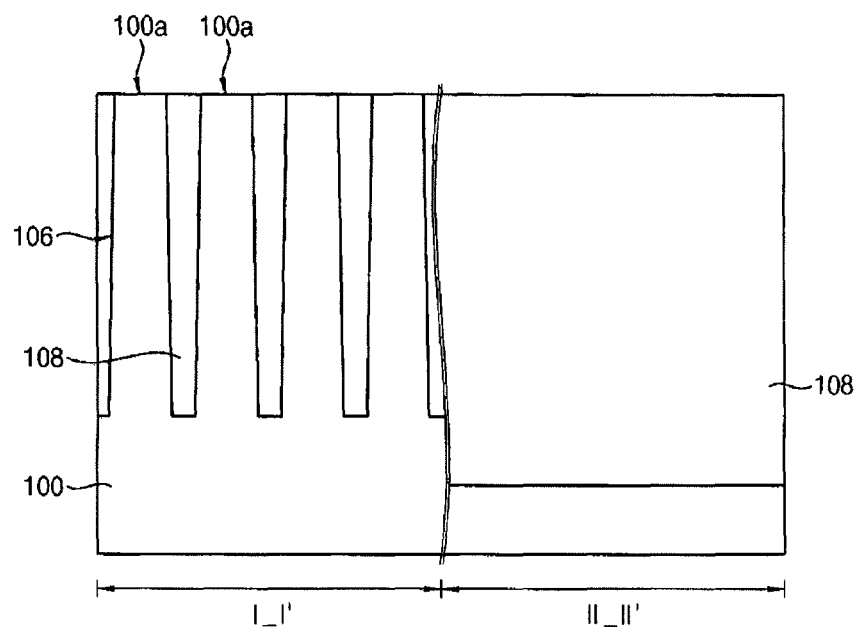
FIGS. 1A to 1J illustrate cross-sectional views of stages in a method for fabricating a semiconductor device in accordance with an exemplary embodiment.

Various example embodiments will be described more fully hereinafter with reference to the accompanying drawings, in which some example embodiments are shown. Example embodiments may, however, be embodied in many different forms and should not be construed as limited to the example embodiments set forth herein. Rather, these example embodiments are provided so that this description will be thorough and complete, and will fully convey the exemplary implementations to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit example embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be described in detail with reference to the accompanying drawings.

Example Embodiment 1

FIGS. 1A to 1J illustrate cross-sectional views of stages in a method for fabricating a semiconductor device in accordance with an exemplary embodiment. FIGS. 2A to 2G are plan views corresponding to respective cross-sectional views.

Figure 1B:
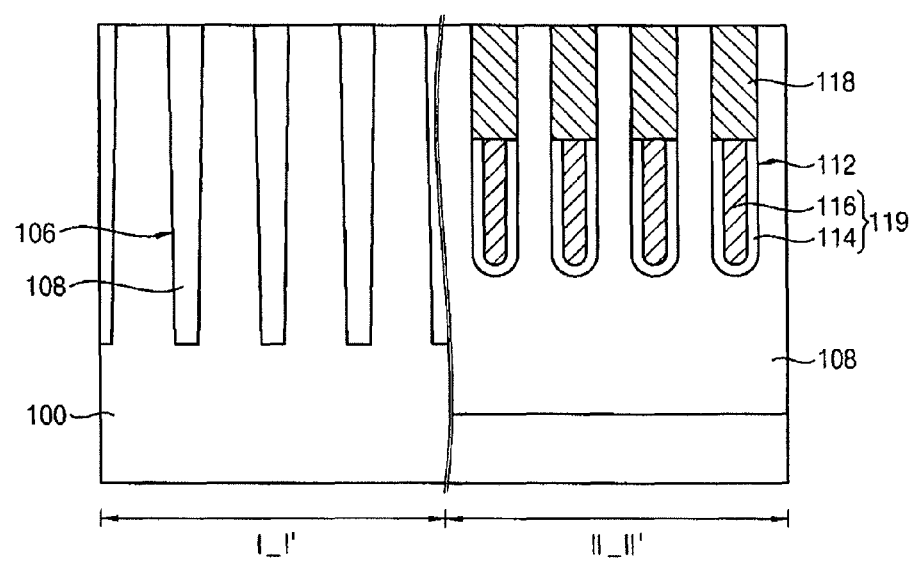
Figure 1C:
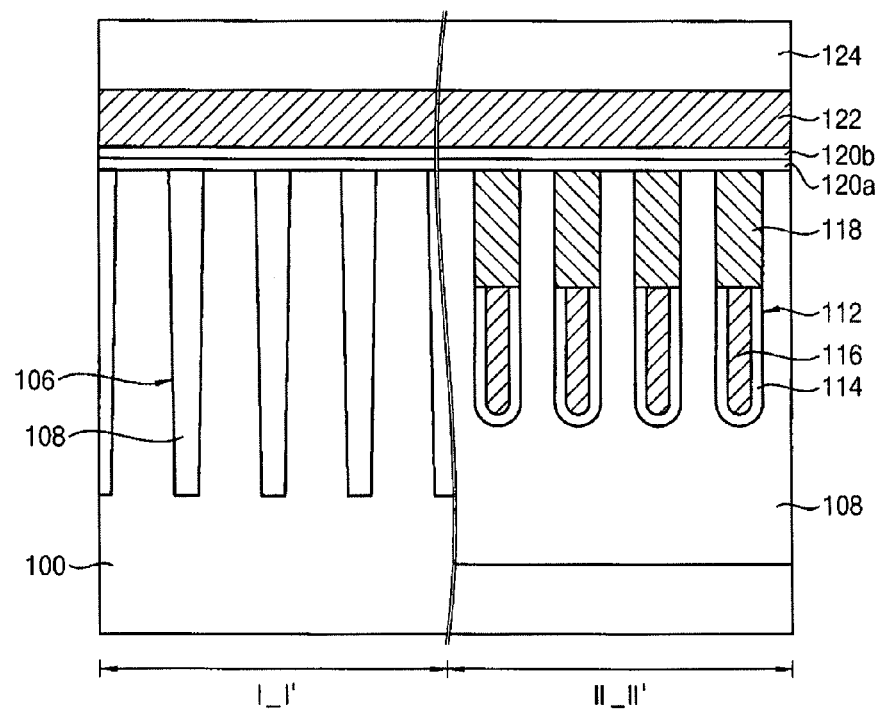
Figure 1D:
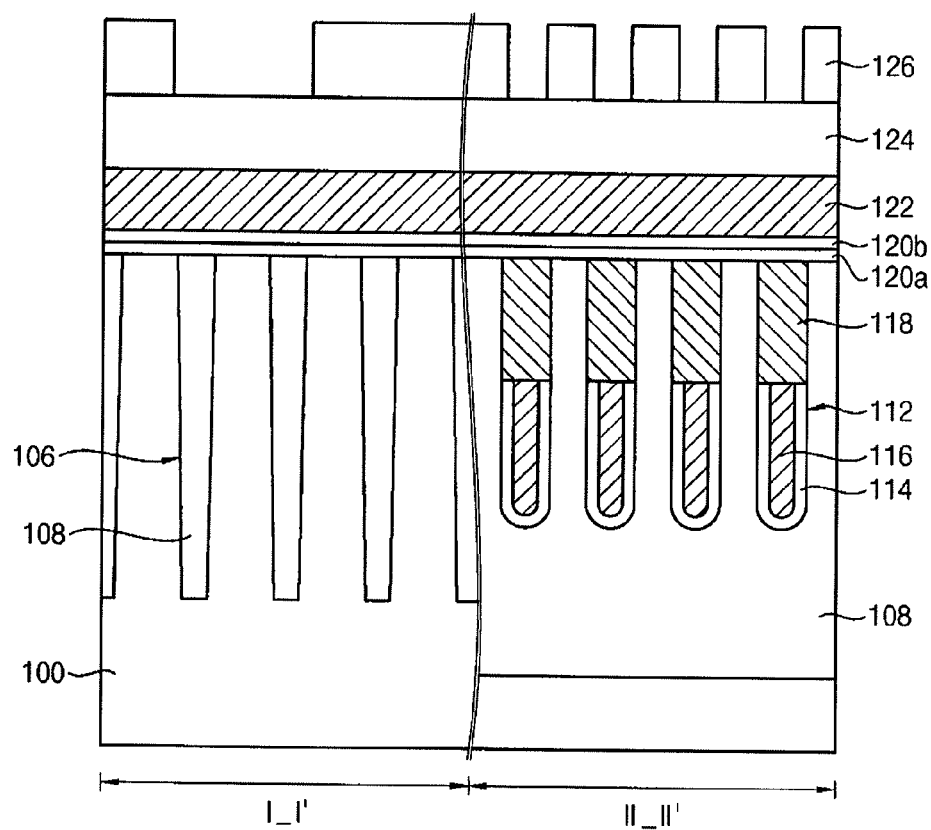
Figure 1E:
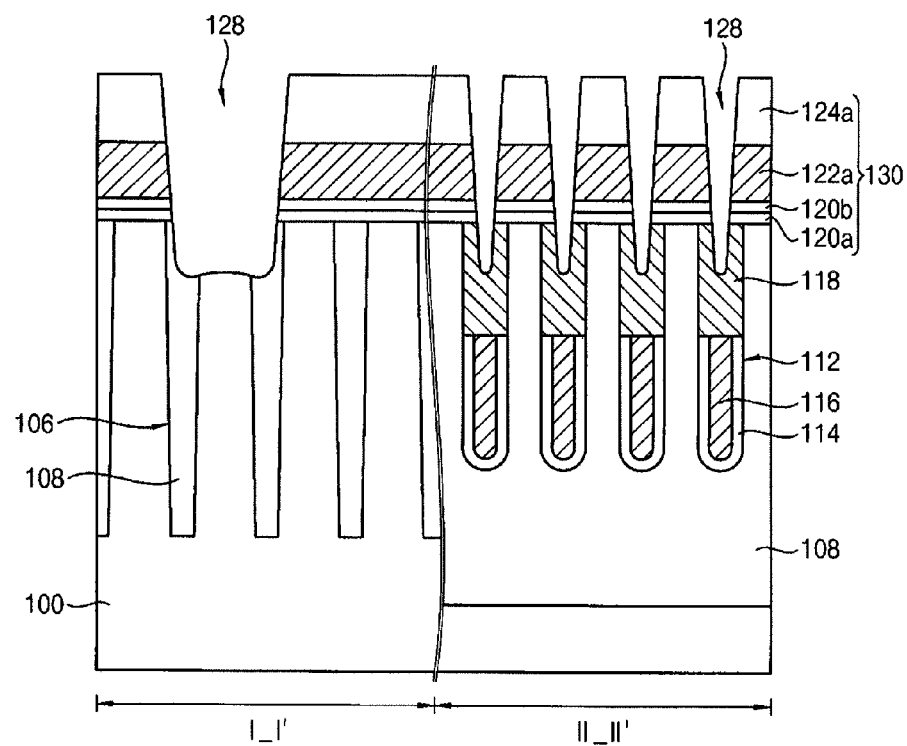
Figure 1F:
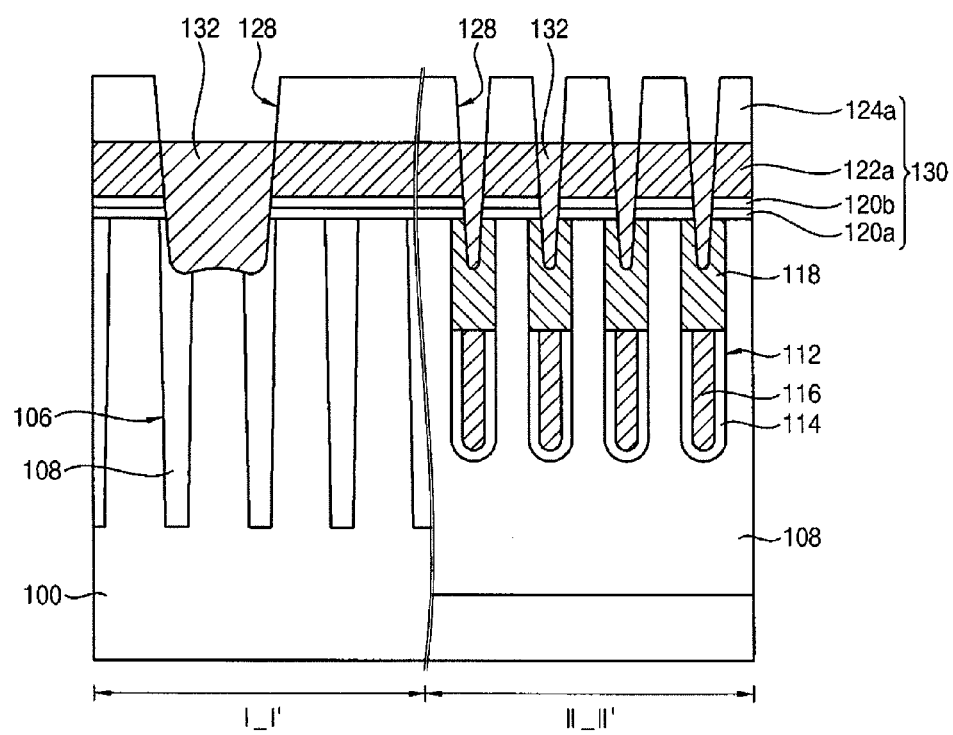
Figure 1G:
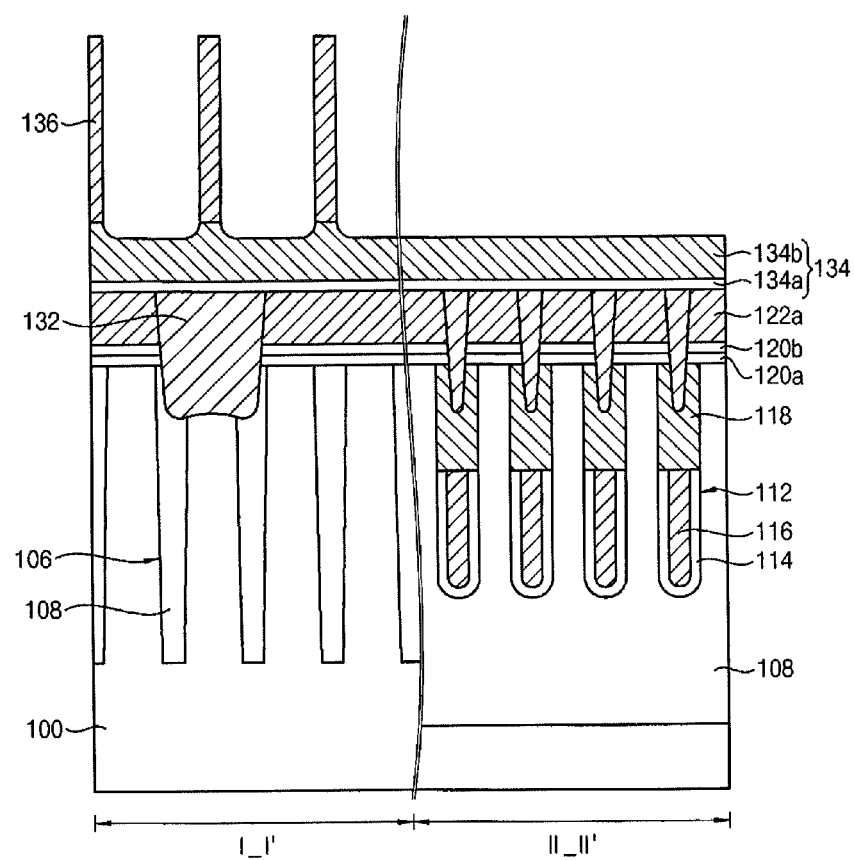
Figure 1H:
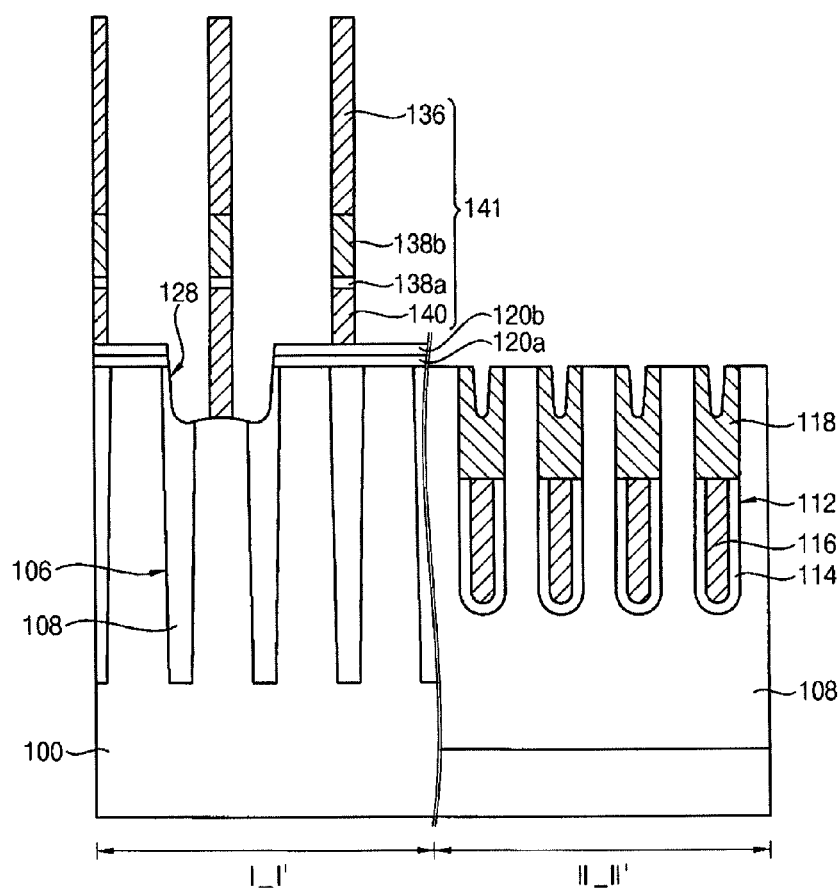
Figure 1I:
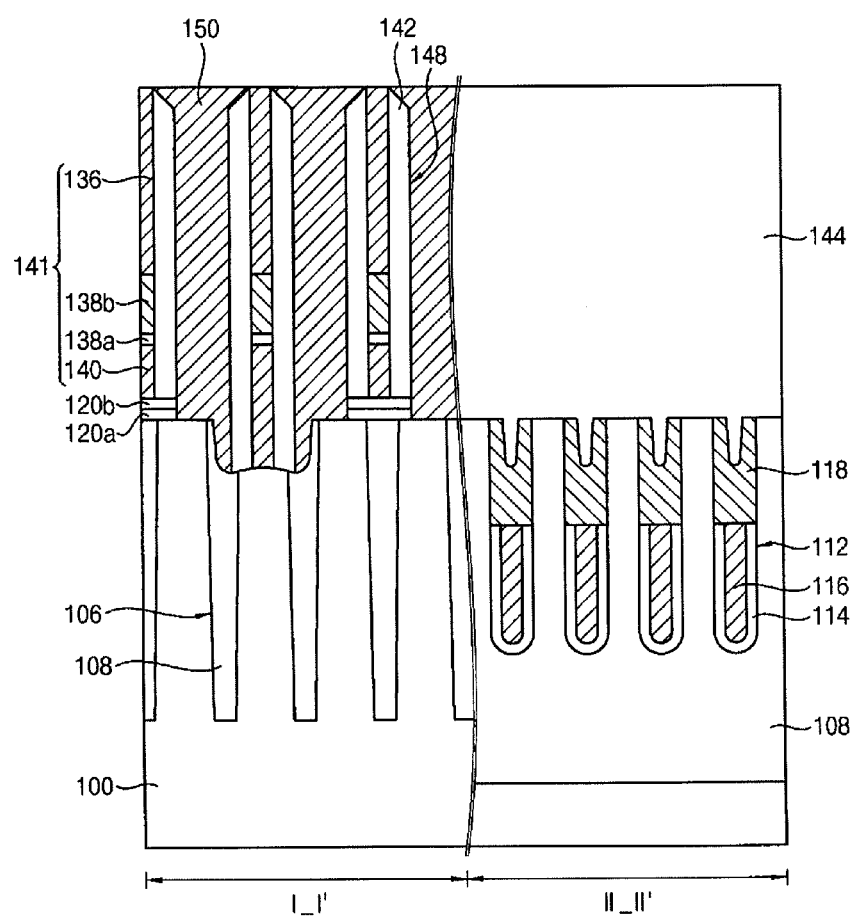
Figure 1J:
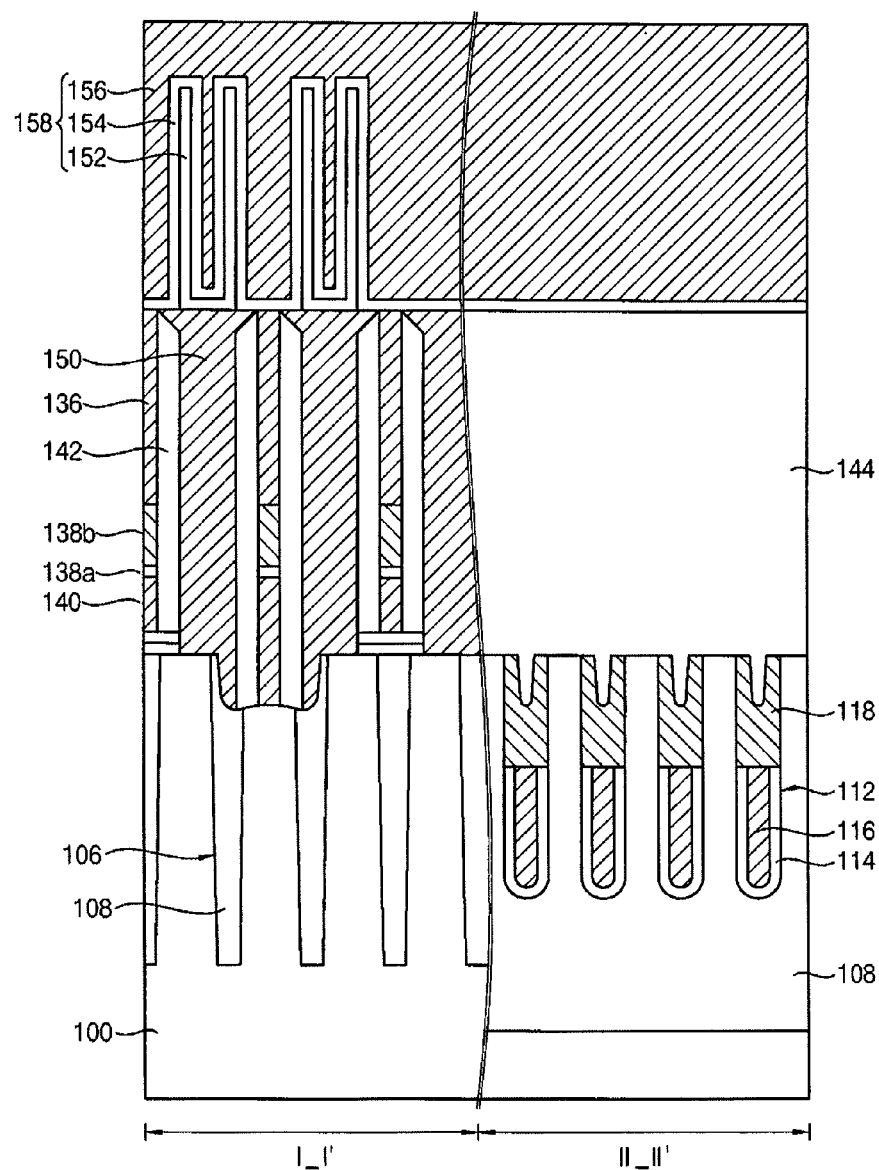
Figure 2A:
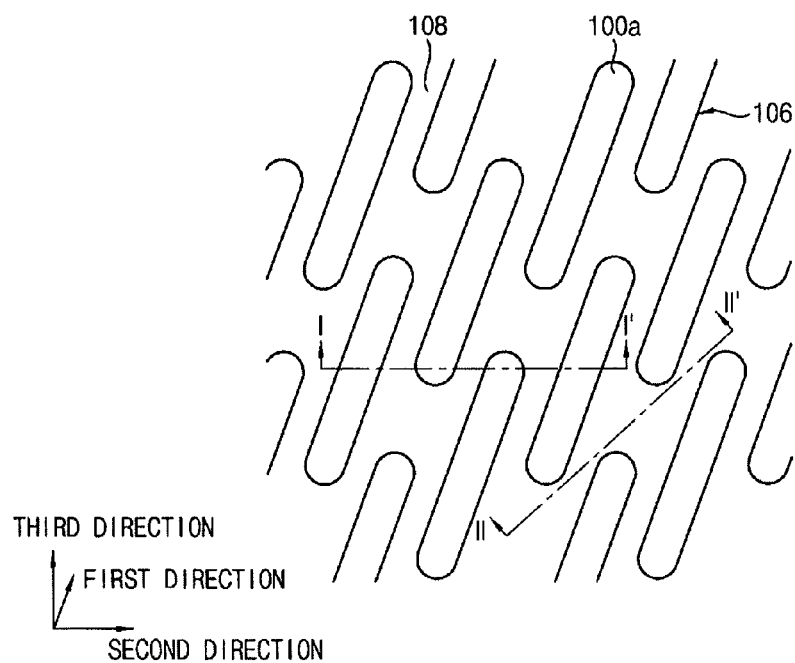
FIGS. 2A to 2G illustrate plan views corresponding to respective cross-sectional views in FIGS. 1A to 1G.

In FIGS. 1A to 1J, the left-side cross-sectional views are taken along a line I-I' in FIG. 2A, and the right-side cross-sectional views are taken along a line II-II' in FIG. 2A. Hereinafter, the longitudinal direction of active regions may be called as a first direction, the extended direction of buried gate structures may be called as a second direction, and a perpendicular direction to the second direction may be called as a third direction.

Referring to FIGS. 1A and 2A, a hard mask pattern (not illustrated) for forming device isolating trenches may be formed in a substrate 100 including single crystalline silicon. The hard mask pattern may include silicon nitride.

The substrate 100 may be anisotropically etched by using the hard mask pattern as an etching mask to form a device isolating trench 106. The substrate 100 excluding the device isolating trench 106 may have a relatively extruded shape. Thus, the surface of the substrate 100 at the extruding portion may be provided as an active region 100a.

As illustrated in the drawings, the active region 100a may have an isolated island shape having the longitudinal direction thereof in the first direction. In addition, the active regions 100a may be arranged in parallel to each other in the first direction. The first direction may not be perpendicular to the second direction, which may be the extended direction of a buried gate structure. Also, the first direction may not be perpendicular to the third direction which is the extended direction of a bit line structure. For example, the first direction may be diagonal to the second and third directions.

Each of the active regions may include a first contact forming region (see FIG. 2B, 110a) on an upper surface portion of a center portion thereof and second and third contact forming regions (see FIG. 2B, 110b and 110c) at the upper surface portion of edge portions thereof. That is, the first contact forming region 110a may be a region for electrically connecting with a bit line structure, and the second and third contact forming regions 110b and 110c may be regions for electrically connecting with capacitors. With respect to neighboring active patterns 100a in the second direction, the second contact forming region 110b and the third contact forming region 110c may be disposed closely. In each of the active regions, the first to third contact forming regions 110a to 110c may not have an overlapping portion but may be isolated from each other.

A device isolating insulation layer filling up the inner portion of the device isolating trench 106 may be formed. The device isolating insulation layer may include silicon oxide. Alternatively, the device isolating insulation layer may have a stacked structure of at least one silicon oxide and at least one silicon nitride. The inner width of the device isolating trench 106 may change according to a position for forming the device isolating trench 106. According to the inner width of the device isolating trench, the stacked structure of the device isolating insulation layer filling up the inner portion of the device isolating trench may be changed.

Then, the device isolating insulation layer may be planarized to form a device isolating layer pattern 108. Through conducting the planarization process, most of a first hard mask pattern on the substrate in the active region may be removed.

Even though not illustrated, impurities may be doped into the substrate 100 to form an impurity region under the surface of the substrate. The impurity regions may be provided as a source region and a drain region of a buried transistor.

Figure 2B:
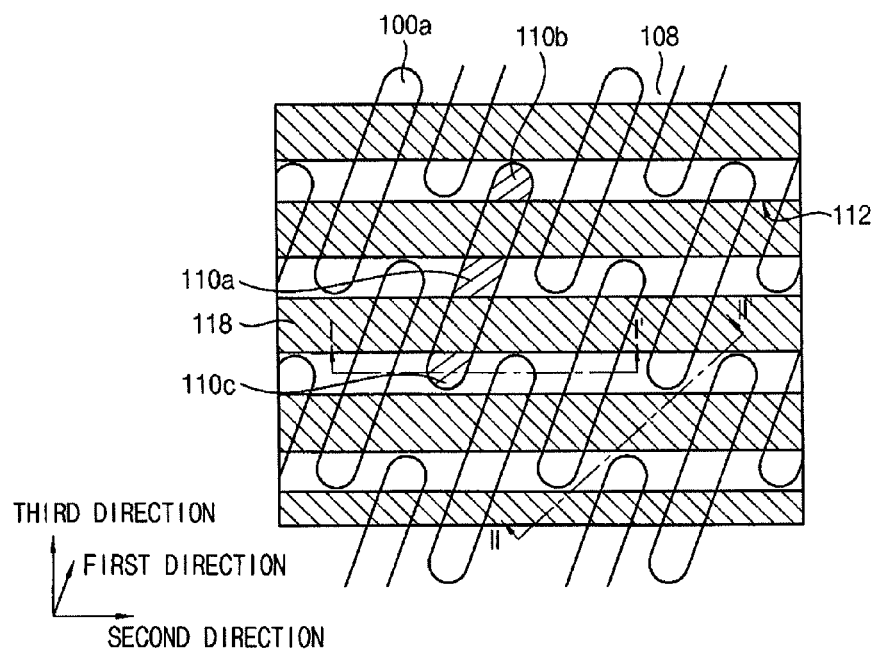

Referring to FIGS. 1B and 2B, the substrate 100 in the active region 100a and the device isolating layer pattern 108 may be partially etched to form gate trenches 112 having a line shape extended in the second direction. In one isolated active region 100a, two gate trenches 112 may be separately disposed in parallel. In addition, one gate trench 112 may be spaced apart from each of both edge portions of the isolated active region 100a.

A gate insulating layer 114 may be formed along the side wall and the bottom portion of the gate trench 112. The gate insulating layer 114 may be formed by a thermal oxidation process or a chemical vapor deposition process. On the gate insulating layer 114, a conductive layer (not illustrated) filling up the gate trench 112 may be formed. The conductive layer may be formed by depositing a barrier metal layer and a metal layer one by one. Examples of materials that may be used for the barrier metal layer may include titanium, titanium nitride, tantalum, tantalum nitride, etc. These materials may be used alone or by stacking two or more. In addition, examples of materials that may be used for the metal layer may include tungsten. After planarizing the conductive layer through a chemical mechanical polishing process, an etch back process may be conducted to form a buried gate electrode 119 filling up a portion of the gate trench 112.

An insulating layer filling up the inner portion of the gate trench 112 may be formed on the buried gate electrode 119. Then, the insulating layer may be planarized to form an insulating layer pattern 118. The insulating layer pattern 118 may include a silicon nitride layer.

Through conducting the above processes, a buried gate structure having a line shape extended in the second direction may be formed in the substrate of the active region 100a and the device isolating layer pattern 108. In the active region, the upper surface of the insulating layer pattern 118 may be exposed in the forming region of the buried gate structure. Thus, the upper surface of the substrate 100 may be exposed in the active region between the buried gate structures, and the upper surface portion of the substrate 100 may be provided as a substantial contact region.

Referring to FIG. 1C, a pad insulating layer 120a and an etch stopping layer 120b may be formed on the substrate 100. The pad insulating layer 120a may include, e.g., silicon oxide. The etch stopping layer 120b may be formed by using an insulating material having a high etching selectivity with respect to the silicon oxide. The etch stopping layer 120b may include, e.g., silicon nitride.

A first conductive layer 122 may be formed on the etch stopping layer 120b. The first conductive layer 122 may be formed by using a material which may be easily etched through a dry etching process. For example, the first conductive layer 122 may include a polysilicon material. The first conductive layer 122 may be provided as portions of bit lines through a subsequent process. Thus, the thickness of the first conductive layer 122 may be controlled according to the height of bit lines structure formed on the etch stopping layer 120b.

A sacrificial layer 124 may be formed on the first conductive layer 122. The sacrificial layer 124 may be formed to passivate the first conductive layer 122 while conducting a subsequent etching process. For example, the sacrificial layer 124 may include silicon oxide.

Referring to FIG. 1D, a photoresist layer may be coated on the sacrificial layer 124. The photoresist layer may be patterned through a photo process to form photoresist patterns 126. Each of the photoresist patterns 126 may be formed to have an isolated shape defining portions of the second and third contact forming regions 110b and 110c and a portion of the device isolating layer pattern 108 at the adjacent portion of the second and third contact forming regions 110b and 110c.

As illustrated in the drawings, the second and third contact forming regions 110b and 110c provided in one active region 100a may be covered by different isolated photoresist patterns 126, respectively. In addition, one isolated photoresist pattern 126 may have a shape covering upper portions of both of the second and third contact forming regions 110b and 110c included in different active regions 100a. That is, one isolated photoresist pattern 126 may be formed to have a shape covering both of the second contact forming region 110b in one active region 100a and the third contact forming region 110c in another active region 100a adjacently disposed in the second direction.

As described above, the photoresist patterns 126 may not cover the first contact forming region 110a and the adjacent regions around the first contact forming region 110a. Thus, the exposed portion between the photoresist patterns 126 may be largely increased.

Figure 2C:
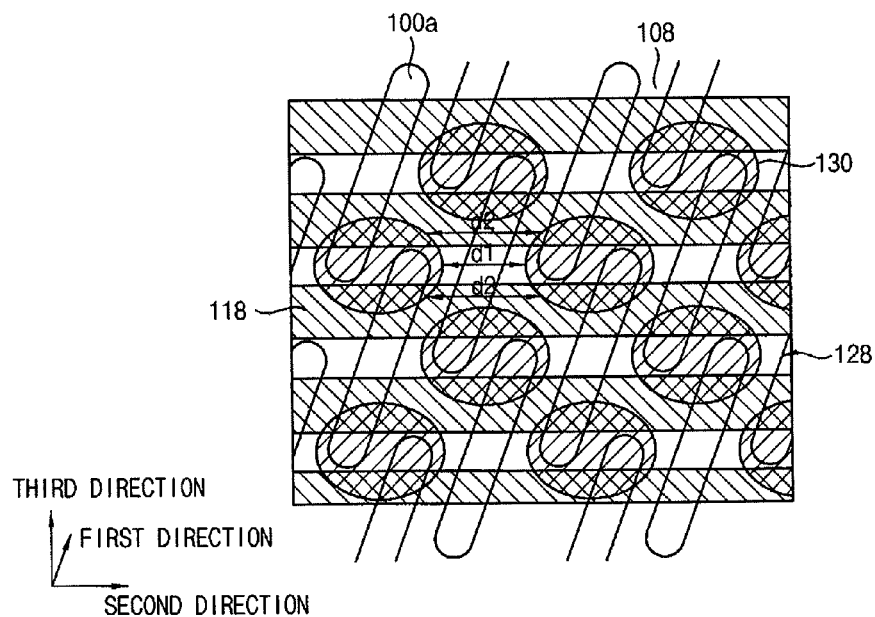

Referring to FIGS. 1E and 2C, the sacrificial layer 124, the first conductive layer 122, the etch stopping layer 120b, the pad insulating layer 120a, and the surface portion of the underlying substrate 100 may be etched by using the photoresist patterns 126 as an etching mask to form a first opening portion 128.

Through conducting the etching process, stacked structures 130 of the pad insulating layer 120a, the etch stopping layer 120b, a first preliminary conductive layer pattern 122a, and a sacrificial layer pattern 124a on the substrate 100 may be formed. Each of the stacked structures 130 may have an isolated pillar shape covering the second and third contact forming regions 110b and 110c. Particularly, the structures 130 may have a cylindrical shape or an elliptic cylindrical shape. In addition, the first opening portion 128 may be formed between the stacked structures 130.

Through the bottom portion of the first opening portion 128, the first contact forming region 110a and the adjacent regions around the first contact forming region 110a may be exposed. In addition, the first opening portion 128 may not have an isolated contact hole shape defining and exposing the first contact forming region. In other words, the first opening portion 128 may have an open shape, e.g., a geometrical open shape extending to continuously overlap more than one first contact forming region 110a, exposing a region between the structures 130.

An inner width of the first opening portion 128 may be determined by distances (d1 and d2) between facing, e.g., adjacent, structures 130. The inner width of the first opening portion 128 at the portion exposing the first contact forming region 110a may have the narrowest width at a center portion (d1 portion) of the first contact forming region 110a. The inner width of the first opening portion 128 may be increased at a portion spaced apart from the center portion (d2 portion) of the first contact forming region 110a. Thus, the minimum width (d1) of the first opening portion 128 at the portion exposing the first contact forming region 110a may be greater than the width of the first contact forming region 110a.

In the etching process, the surface portion of the substrate 100 may be partially etched to form the first opening portion 128. Thus, the active region in the first opening portion 128 may be positioned lower than the active region of another portion. As described above, through forming a step difference between the active regions 100a, bridge defects between a bit line contact and a storage node contact formed in subsequent processes may be decreased.

Figure 2D:
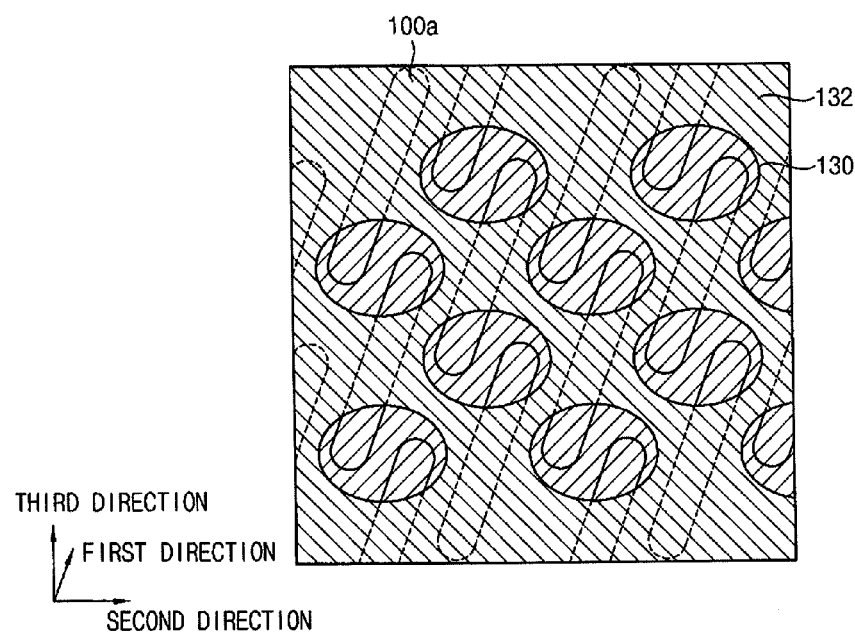

Referring to FIGS. 1F and 2D, a second conductive layer filling up the inner portion of the first opening portion 128 may be formed on the sacrificial layer pattern 124a. The second conductive layer may be provided as a conductive layer for forming the bit line contact.

The second conductive layer may include the same conductive material as the first conductive layer 122. For example, the second conductive layer may include a polysilicon layer. Alternatively, the second conductive layer may include a different material from the first conductive layer 122, e.g., the second conductive layer may include a metal material.

The second conductive layer may be etched back to form a second preliminary conductive layer pattern 132 in the first opening portion 128. The etch back process may be conducted so that the upper surface of the second preliminary conductive layer pattern 132 may be positioned at a same plane as, e.g., level with, the upper surface of the first preliminary conductive layer pattern 122a. Thus, the upper surfaces of the second preliminary conductive layer pattern 132 and the first preliminary conductive layer pattern 122a may have a planar, e.g., level, surface. Since the sacrificial layer pattern 124a may be formed on the first preliminary conductive layer pattern 122a, the damage of the first preliminary conductive layer pattern 122a during conducting the etch back process may be prevented.

Figure 2E:
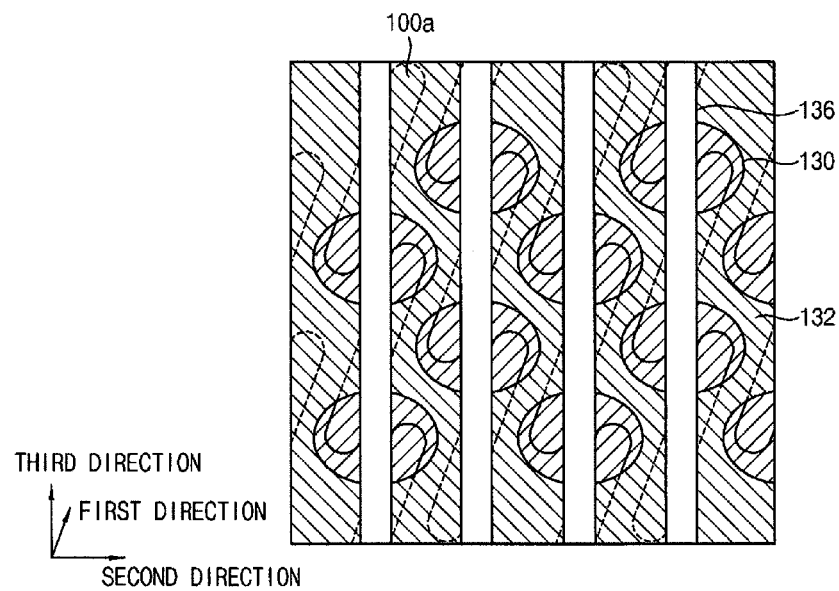

Referring to FIGS. 1G and 2E, the sacrificial layer pattern 124a may be removed. A third conductive layer 134 may be formed on the first preliminary conductive layer pattern 122a and the second preliminary conductive layer pattern 132. The third conductive layer 134 may include a metal material having a lower resistance than the first and second preliminary conductive layer patterns 122a and 132. As illustrated in the drawings, the third conductive layer 134 may be formed by stacking a barrier metal layer 134a and a metal layer 134b one by one. Examples of materials that may be used for the barrier metal layer 134a may include titanium, titanium nitride, tantalum, tantalum nitride, etc. These materials may be used alone or by stacking two or more. In addition, examples of materials that may be used for the metal layer 134b may include tungsten.

In example embodiments, the conductive layer used for bit line structures may be explained by illustrating the stacking structure of polysilicon, the barrier metal, and the metal. However, the stacking structure used for the bit line structures may be varied diversely by changing the stacking order of the conductive layer.

A hard mask layer may be formed on the third conductive layer 134. The hard mask layer may include silicon nitride. The hard mask layer may be patterned to form a hard mask pattern 136 having a line shape for forming the bit line structures. The hard mask pattern may have a line shape being extended in the third direction and forming a portion of the first contact forming region 110a.

Figure 2F:
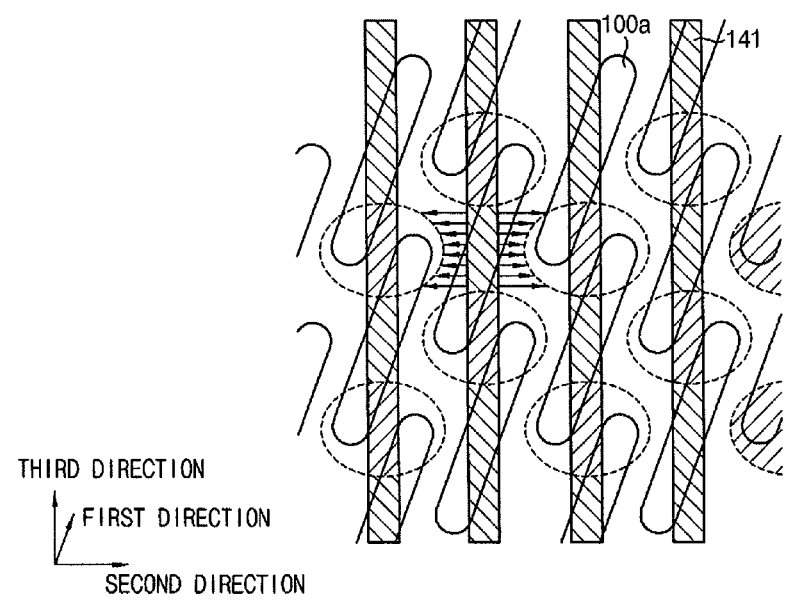

Referring to FIGS. 1H and 2F, the third conductive layer 134, the second preliminary conductive layer pattern 132, and the first conductive layer pattern 122a may be anisotropically etched by using the hard mask pattern 136 as an etching mask to form bit line structures 141. The bit line structures 141 may make direct contact with the surface of the substrate in the first contact forming region 110a (A portion in FIG. 2G) and have a line shape extended in the third direction.

The line width of the bit line structure 141 may be smaller than the width of the first opening portion 128 positioned in the first contact forming region 110a. Accordingly, the bit line structure 141 may be positioned in the first opening portion 128, and both side walls of the bit line structure 141 and the side wall of the first opening portion 128 may be spaced apart. Since the first opening portion 128 may not have a contact hole shape having an isolated inner width, but may have an open shape at both sides thereof, the distance between each side wall of the bit line structure 141 and a corresponding side wall of the first opening portion 128 may be greater when compared with a distance of a first opening portion having an isolated contact hole shape, e.g., a shape having a closed geometrical shape overlapping only a single contact.

In contrast, when a conventional first opening portion has a contact hole shape having an isolated inner width, the separated distance between the side wall of the first opening portion and the side wall of the bit line structure may be very small. For example, the separated distance between the side wall of the first opening portion and the side wall of the bit line structure may be gradually decreased when the first contact forming region is deviated from the center portion of the first contact forming region.

Since the first opening portion 128 in accordance with example embodiments may exclude the isolated shape, as illustrated by arrows in FIG. 2F, the separated distance between the side wall of the first opening portion 128 and the bit line structure may be gradually increased.

As described above, since the separated distance between the side wall of the first opening portion 128 and the side wall of the bit line structure 141 may be large, etching gases may be easily introduced into the first opening portion 128 during the etching process with respect to the third conductive layer 134, the second preliminary conductive layer pattern 132, and the first preliminary conductive layer pattern 122a. Thus, etch defects caused by insufficiently etching of the second preliminary conductive layer pattern 132 in the first opening portion 128 during the etching process for forming the bit line structure 141 may be decreased.

Figure 2G:
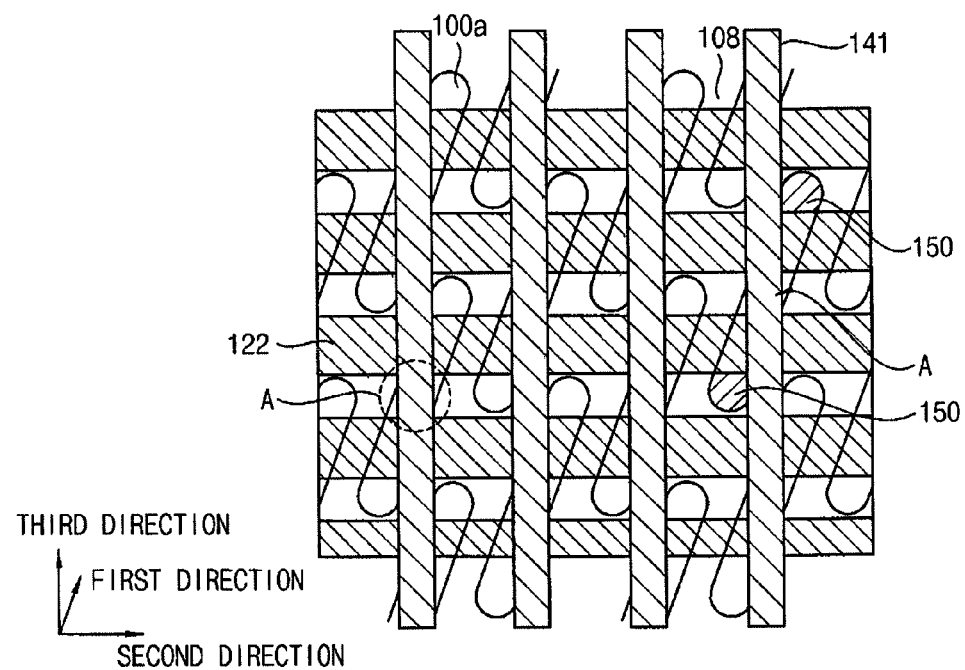

Referring to FIGS. 1I and 2G, insulating spacers 142 may be formed at both side walls of the bit line structure 141. The insulating spacers 142 may include air spacers.

An insulating interlayer 144 covering the bit line structures 141 may be formed. After forming the insulating interlayer 144, a planarization process with respect to the insulating interlayer may be additionally conducted to expose the upper surface of the bit line structures 141. An etching mask pattern may be formed on the insulating interlayer 144. The etching mask pattern may have a shape exposing portions of the second and third contact forming regions 110b and 110c. Thus, the etching mask pattern may expose the upper portion of a portion for forming storage node contacts.

The insulating interlayer 144 may be etched by using the etching mask pattern as an etching mask, and the underlying etch stopping layer 120b and the pad insulating layer 120a may be etched. Through conducting the above processes, storage node contact holes 148 exposing the surfaces of the second and third contact forming regions 110b and 110a may be formed. Then, insulating spacers may be additionally formed at both side walls of the storage node contact holes 148 even though not illustrated.

A conductive layer may be formed in the storage node contact holes 148, and the conductive layer may be polished to form storage node contacts 150. The conductive layer may include, e.g., polysilicon. Alternatively, the conductive layer may include, e.g., a metal material.

Referring to FIG. 1J, a capacitor 158 may be formed on the upper portion of the storage node contact 150. The capacitor 158 may be formed as a cylinder shape capacitor or a stack type capacitor.

Through conducting the above-described processes, a DRAM device may be completed.

Example Embodiment 2

FIGS. 3A to 3F illustrate cross-sectional views of stages in a method for fabricating a semiconductor device in accordance with an exemplary embodiment.

First, the structure illustrated in FIG. 1B may be formed on a substrate by conducting the processes explained referring to FIGS. 1A and 1B.

Figure 3A:
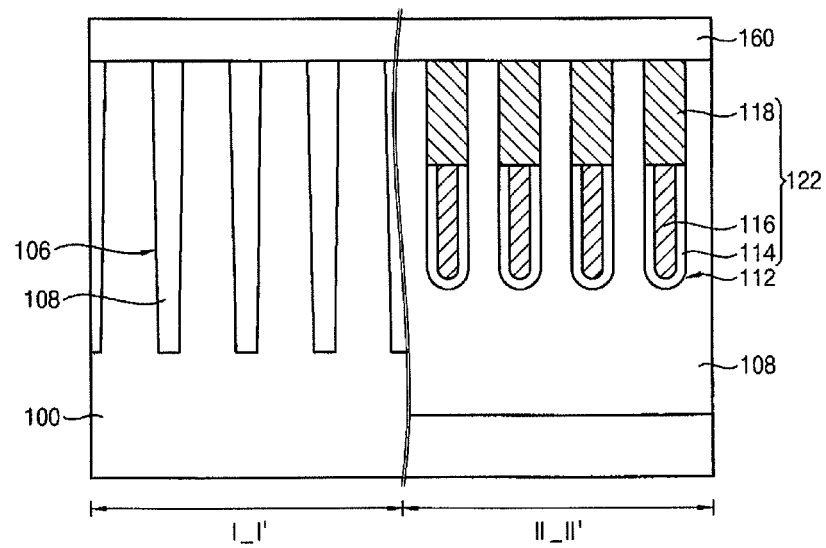
FIGS. 3A to 3F illustrate cross-sectional views of stages in a method for fabricating a semiconductor device in accordance with an exemplary embodiment.

Referring to FIG. 3A, an insulating interlayer 160 may be formed on the substrate 100 including a buried gate electrode. The insulating interlayer 160 may include, e.g., silicon oxide.

Figure 3B:
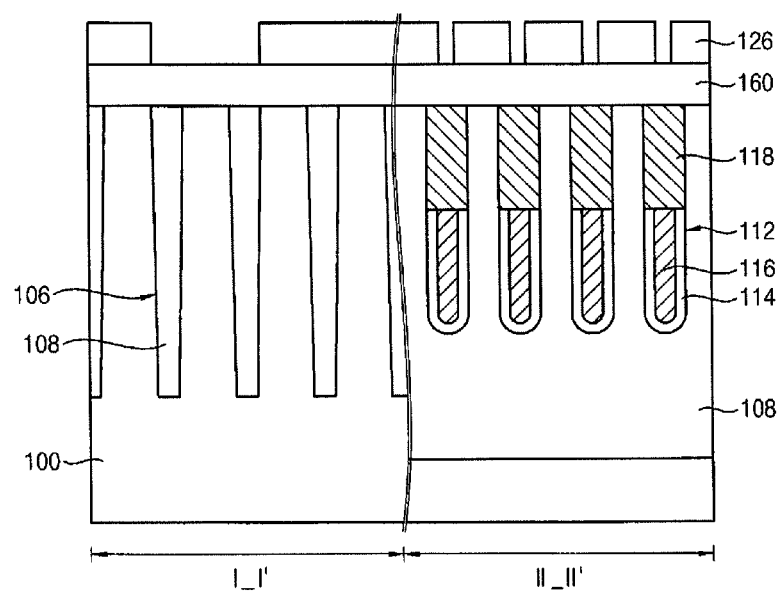

Referring to FIG. 3B, a photoresist layer may be formed on the insulating interlayer 160. The photoresist layer may be patterned through a photo process to form the photoresist patterns 126. The photoresist patterns 126 may be formed so as to have an isolated shape defining portions of the second and third contact forming regions 110b and 110c (see FIG. 2)

and the adjacent upper portion of the device isolating layer pattern 108. The shape of the photoresist pattern 126 may be the same as explained referring to FIG. 1D.

Figure 3C:
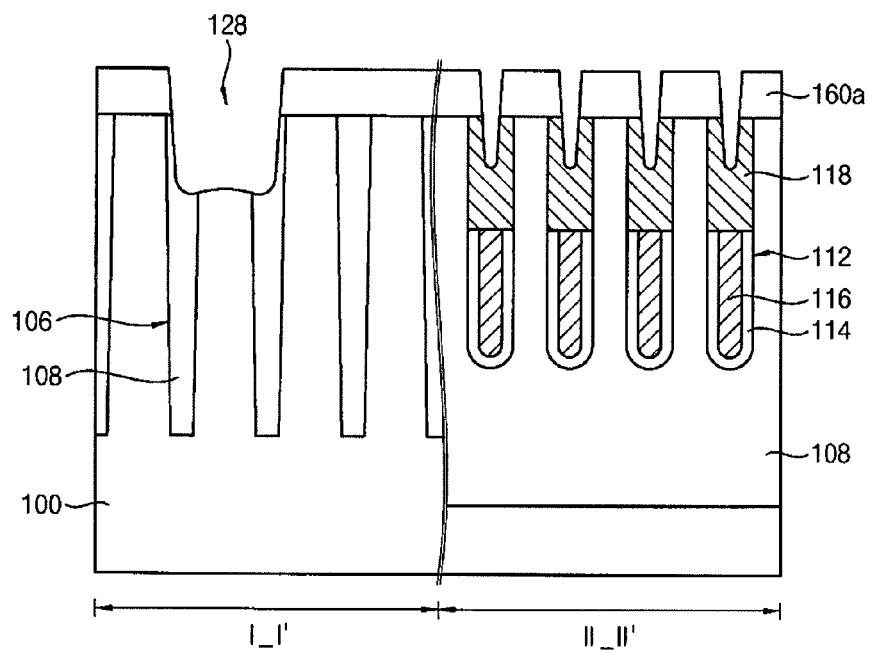

Referring to FIG. 3C, the insulating interlayer 160 and the surface portion of the underlying substrate 100 may be etched by using the photoresist patterns 126 as an etching mask to form the first opening portion 128. Through conducting the etching process, an insulating layer pattern 160a covering the second and third contact forming regions 110b and 110c and having an isolated cylindrical shape or an isolated elliptic cylindrical shape may be formed on the substrate 100. The first opening portion 128 may be formed between the insulating layer patterns 160a.

Through the bottom portion of the first opening portion 128, the first contact forming region 110a and adjacent regions around the first contact forming region 110a may be exposed. The first opening portion 128 may not have an isolated contact hole shape defining and exposing the first contact forming region 110a. The first opening portion 128 may have a shape penetrating from side to side between the insulating layer patterns 160a. The exposed portion from the first opening portion 128 may be the same as that explained referring to FIG. 1E.

Figure 3D:
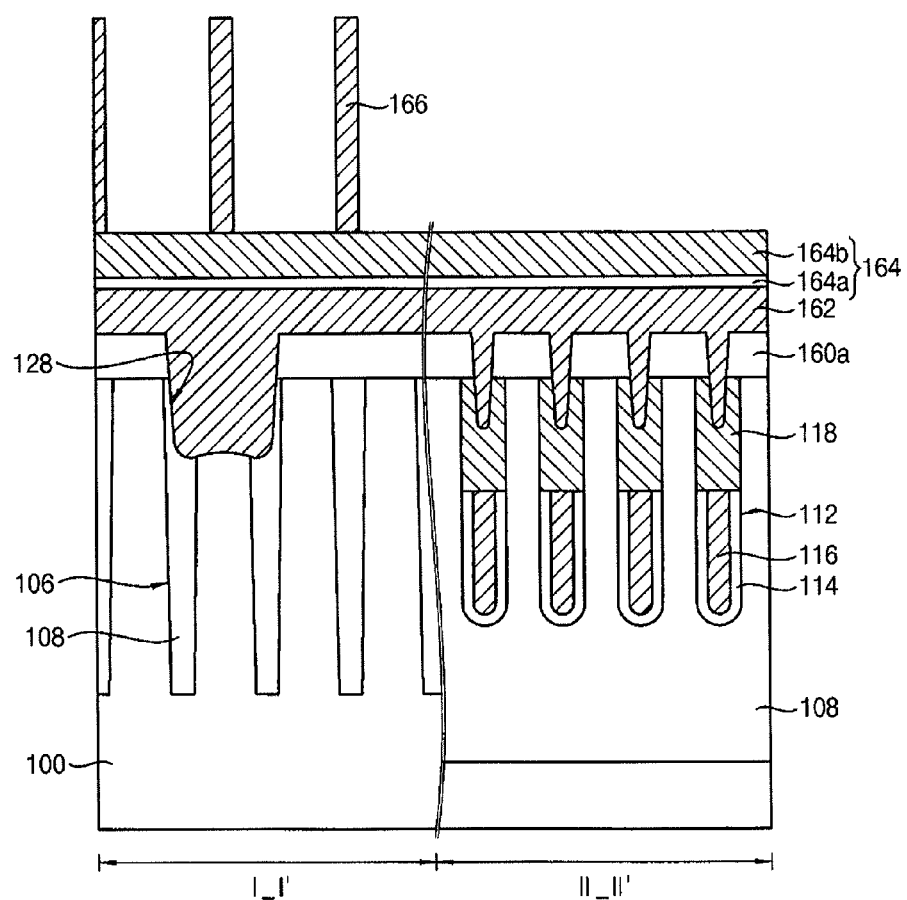

Referring to FIG. 3D, a first conductive layer 162 for forming bit lines may be formed on the insulating layer pattern 160a while filling up the inner portion of the first opening portion 128.

Another method for forming the first conductive layer 162 includes forming a conductive layer filling up the first opening portion 128 and polishing the conductive layer to form a preliminary conductive layer pattern filling up the inner portion of the first opening portion 128. Then, another conductive layer may be additionally formed on the preliminary conductive layer pattern. The conductive layer may include polysilicon.

A second conductive layer 164 may be formed on the first conductive layer 162. The second conductive layer 164 may include a metal material having lower resistance than the first conductive layer 162. The second conductive layer 164 may be formed by stacking a barrier metal layer 164a and a metal layer 164b.

A hard mask layer may be formed on the second conductive layer 164. Then, the hard mask layer may be patterned to form a hard mask pattern 166 having a line shape for forming bit line structures.

Figure 3E:
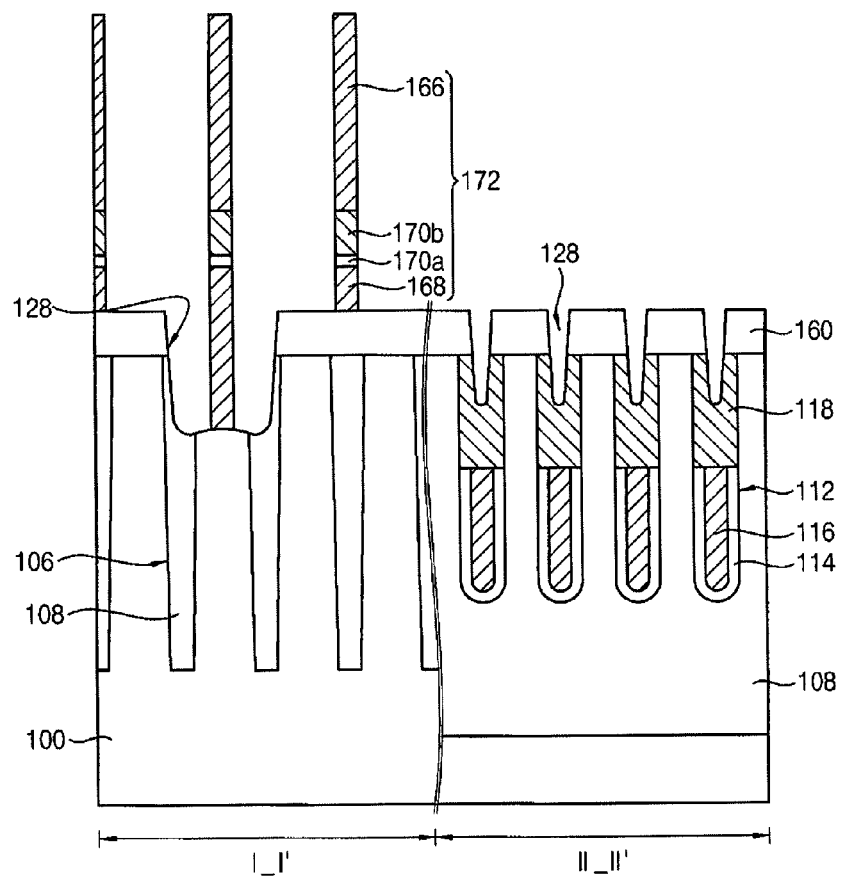

Referring to FIG. 3E, the first and second conductive layers 162 and 164 may be anisotropically etched by using the hard mask pattern 166 as an etching mask to form a bit line structures 172.

The line width of the bit line structure 172 may be smaller than the inner width of the first opening portion 128 positioned in the first contact forming region 110a. Thus, the bit line structure 172 may be positioned in the first opening portion 128, and both side walls of the bit line structure 172 and the side wall of the first opening portion 128 may be spaced apart. Since the first opening portion 128 may not have a contact hole shape having an isolated inner width, but may have a penetrating shape from side to side, the distance between the both side walls of the bit line structure 172 and the side wall of the first opening portion 128 may be greater when compared with a first opening portion having an isolated contact hole shape.

Then, the same processes as explained referring to FIGS. 1I and 1J may be conducted. After completing the processes, a DRAM device illustrated in FIG. 3F may be fabricated.

Example Embodiment 3

FIGS. 4A to 4G illustrate cross-sectional views of stages in a method for fabricating a semiconductor device in accordance with an exemplary embodiment. FIG. 5 is a plan view corresponding to the cross-sectional view in FIG. 4B.

First, the same processes explained referring to FIGS. 1A to 1C may be conducted. Then, a structure including the pad insulating layer, the etch stopping layer, the first conductive layer, and the sacrificial layer stacked on the substrate including the buried gate electrode, as illustrated in FIG. 1C, may be formed.

Figure 4A:
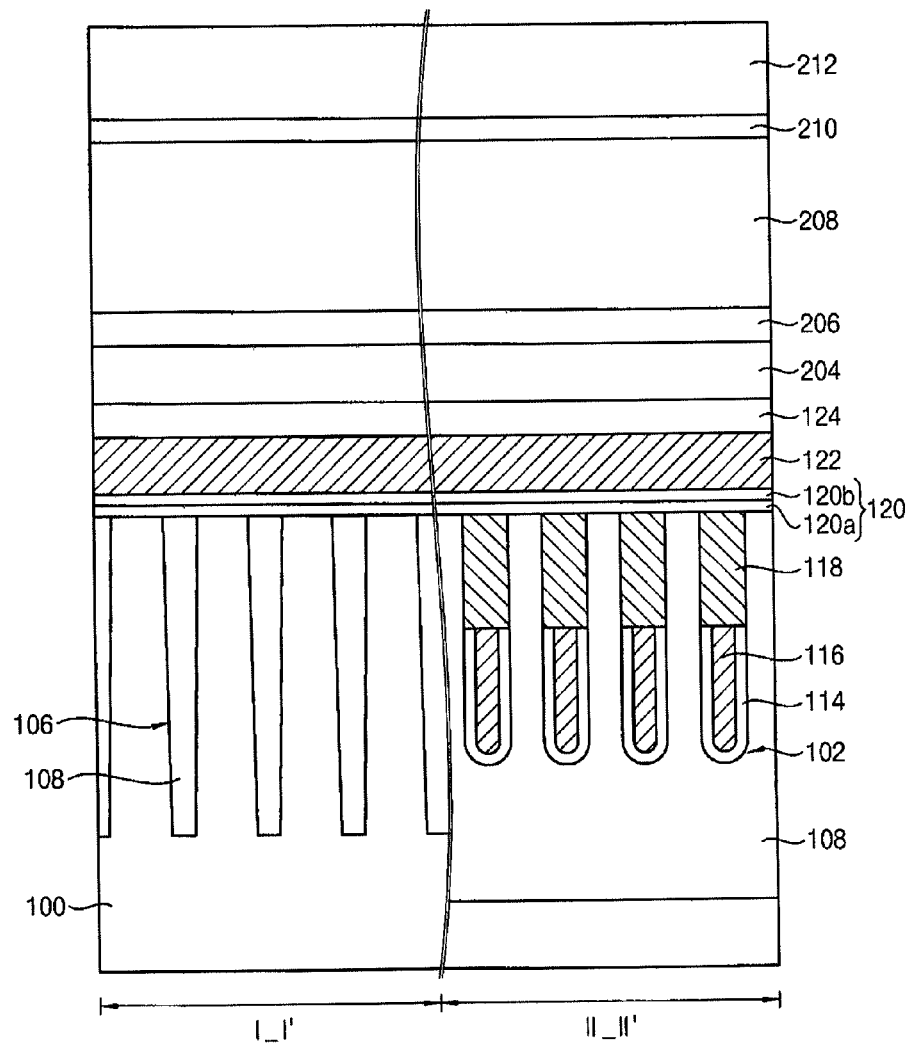
FIGS. 4A to 4G illustrate cross-sectional views of stages in a method for fabricating a semiconductor device in accordance with an exemplary embodiment.
Figure 5:
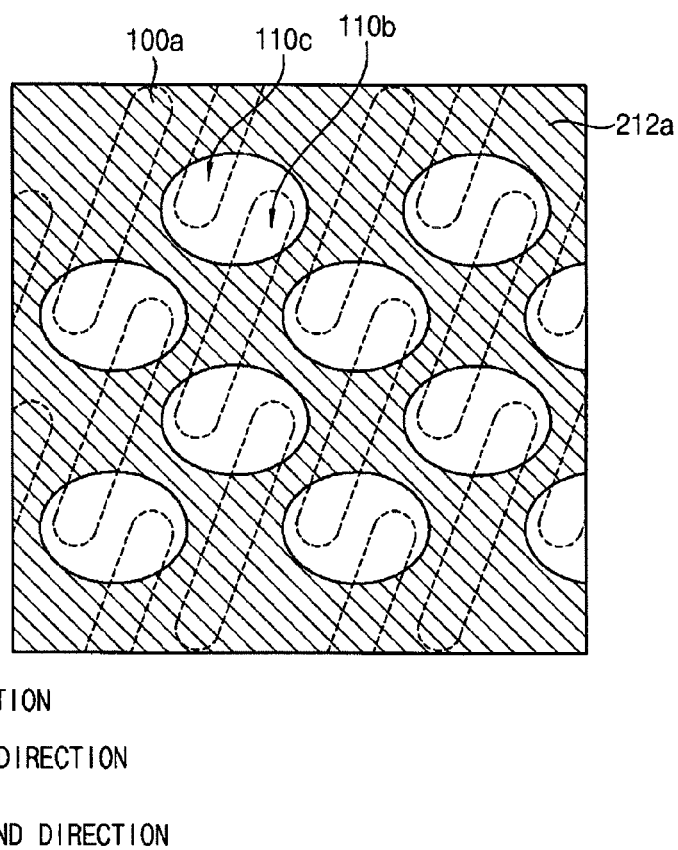

Referring to FIG. 4A, a first mask layer 204 may be formed on the sacrificial layer 124. The first mask layer 204 may include an amorphous carbon layer (ALC).

A first anti reflecting layer 206 may be formed on the first mask layer 204. The first anti reflecting layer 206 may include, e.g., silicon oxynitride. The first anti reflecting layer 206 may be provided as an adhesive layer for improving the adhesive properties of an upper layer and an underlying layer thereof. A second mask layer 208 may be formed on the first anti reflecting layer 206. The second mask layer 208 may include, e.g., a spin-on hard mask layer. The spin-on hard mask layer may be a silicon-based spin-on hard mask layer. On the second hard mask layer 208, a second reflection preventing layer 210 may be formed. The second anti reflecting layer 210 may include, e.g., silicon oxynitride. A photoresist layer 212 may be formed on the second anti reflecting layer 210.

Figure 4B:
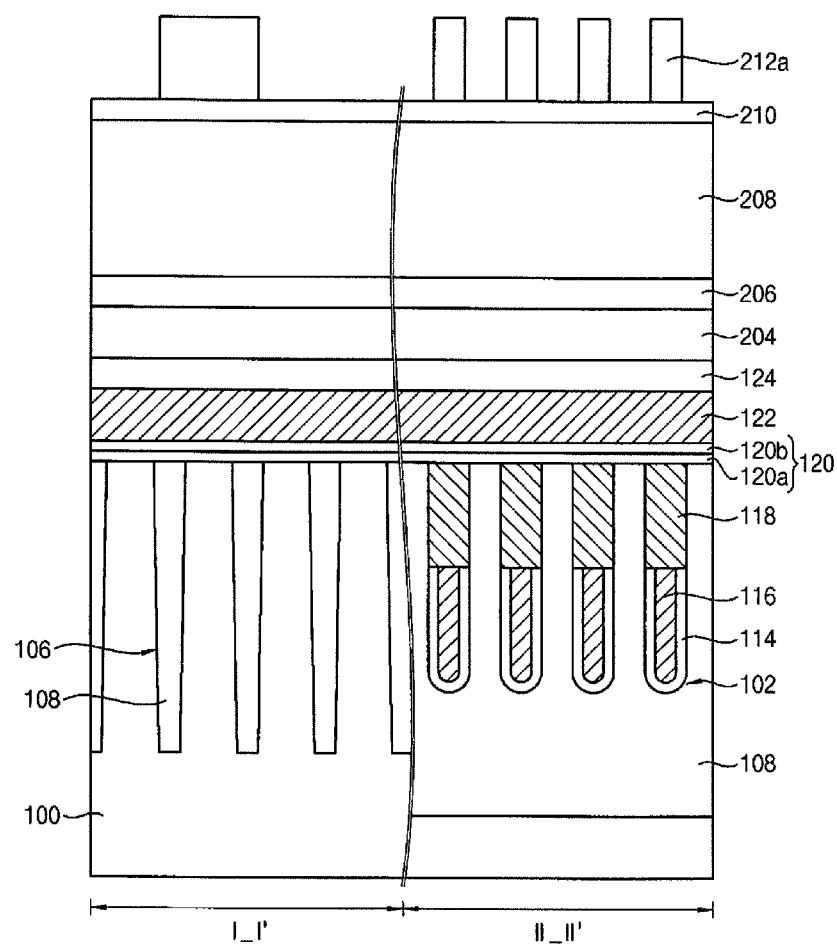

Referring to FIGS. 4B and 5, the photoresist layer 212 may be patterned through a photo process to form photoresist patterns 212a. The photoresist patterns 212a may be formed so as to have a shape defining and exposing upper portions of the second and third contact forming regions 110b and 110c and an upper portion of the device isolating layer pattern 108 adjacent to the second and third contact forming regions 110b and 110c.

As illustrated in the drawings, the upper portions of the second and third contact forming regions 110b and 110c provided in one active region 100a may be exposed by the photoresist patterns 212a.

Figure 4C:
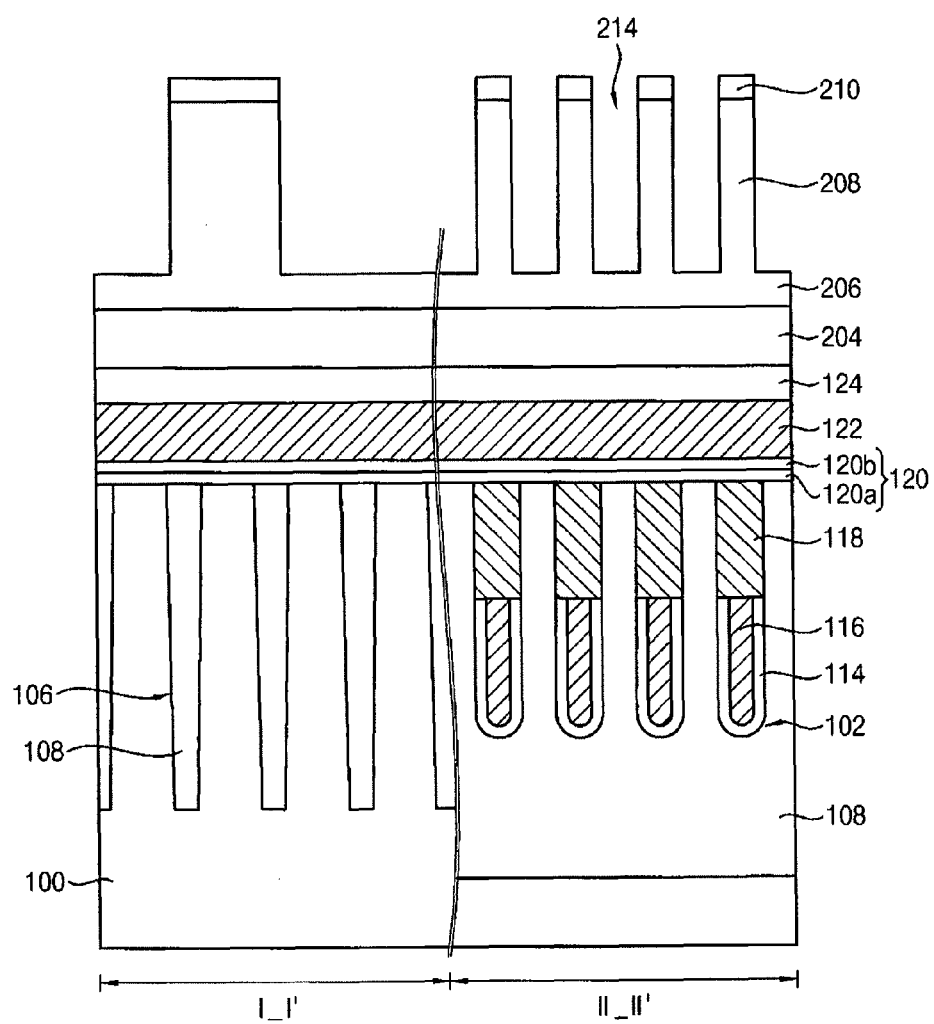

Referring to FIG. 4C, the second anti reflecting layer 210 and the second mask layer 208 may be etched by using the photoresist patterns 212a as an etching mask. Through conducting the processes, a preliminary opening portion 214 exposing portions corresponding to the second and third contact forming regions 110b and 110c may be formed. The first anti reflecting layer 206 may be used as an etch stopping layer during conducting the etching process. Thus, through the bottom portion of the first preliminary opening portion 214, the first anti reflecting layer 206 may be exposed.

Figure 4D:
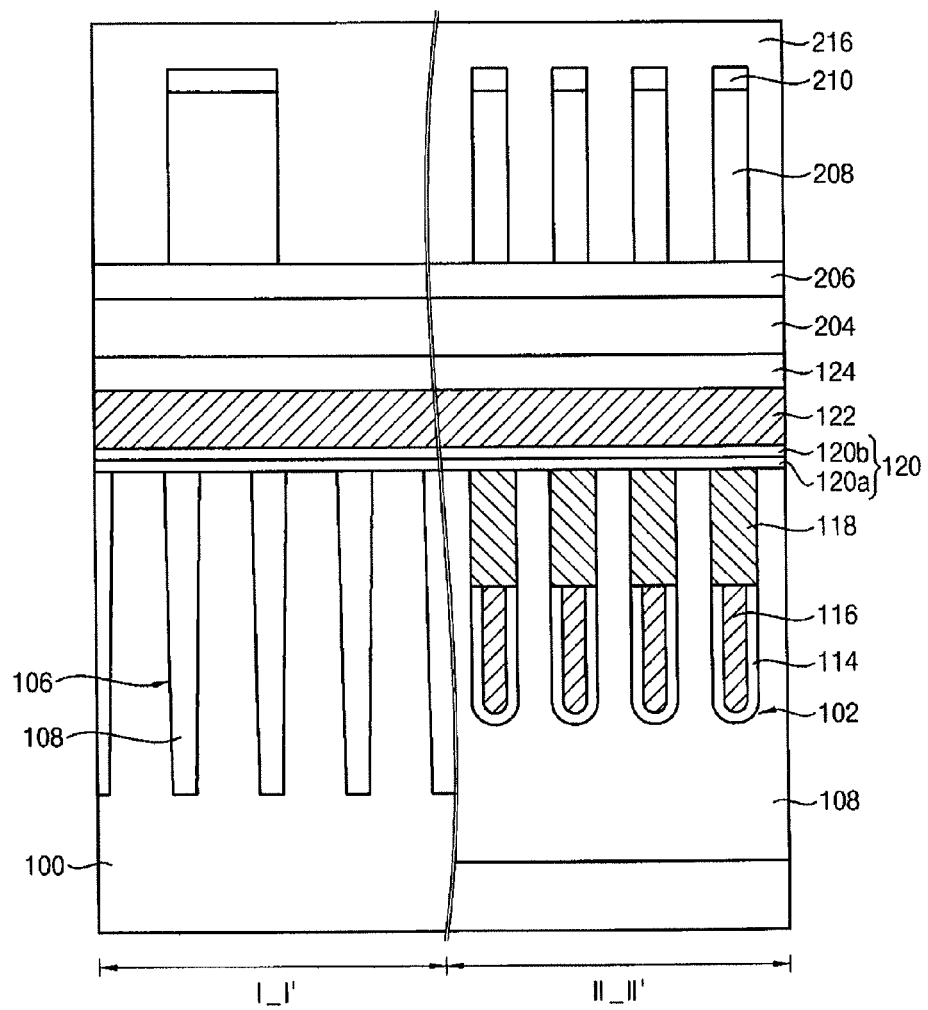

Referring to FIG. 4D, a third mask layer 216 completely filling up the inner portion of the first preliminary opening portion 214 and covering the upper surface of the second anti reflecting layer 210 may be formed. The third mask layer 216 may be formed by using a material having a high etching selectivity with respect to the second mask layer 208. In addition, the third mask layer 216 may be formed by using a material having a high etching selectivity with respect to the first reflection preventing layer 206. For example, the third mask layer 216 may include silicon oxide.

Figure 4E:
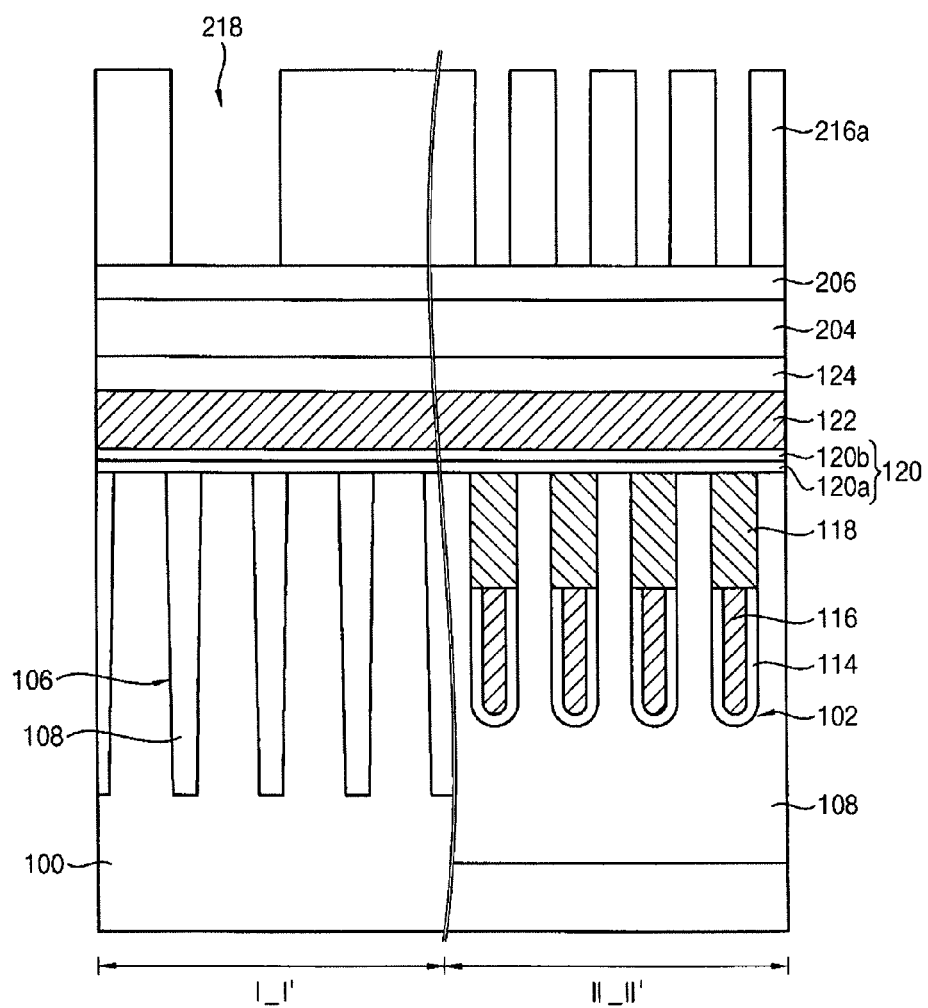

Referring to FIG. 4E, the third mask layer 216 may be planarized to form a third mask pattern 216a filling up the inner portion of the first preliminary opening portion 214. The planarization process may include a blanket etch back process or a chemical mechanical polishing process. Through the planarization process, most of the second anti reflecting layer 210 may be removed.

The third mask pattern 216a formed by the planarization process may be positioned at portions corresponding to the second and third contact forming regions 110b and 110c, and may have a cylindrical shape or an elliptic cylindrical shape.

The second mask layer 208 between the third mask patterns 216a may be removed to form a second preliminary opening portion 218. The second preliminary opening portion 218 may correspond to a portion between the third mask patterns 216a.

The second preliminary opening portion 218 may have a shape exposing the upper portion of adjacent regions around the first contact forming region 110a along with the upper portion of the first contact forming region 110a. In addition, the second preliminary opening portion 218 may not have an isolated contact hole shape defining and exposing the first contact forming region 110a. The second preliminary opening portion 218 may have an opened shape from side to side through the third mask patterns 216a.

Figure 4F:
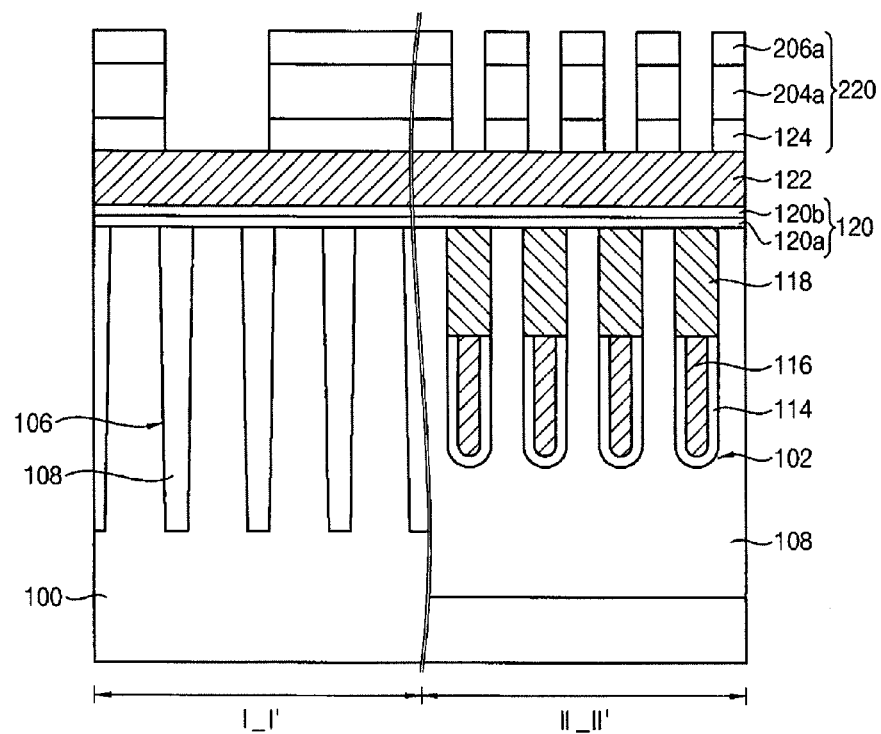

Referring to FIG. 4F, the first reflection preventing layer 206, the first mask layer 204, and the sacrificial layer 124 may be etched by using the third mask pattern 216a as an etching mask. Through conducting the processes, an etching mask pattern 220 including a stacked structure of a sacrificial layer pattern 124a, a first mask pattern 204a, and a first anti reflecting layer pattern 206a may be formed.

Figure 4G:
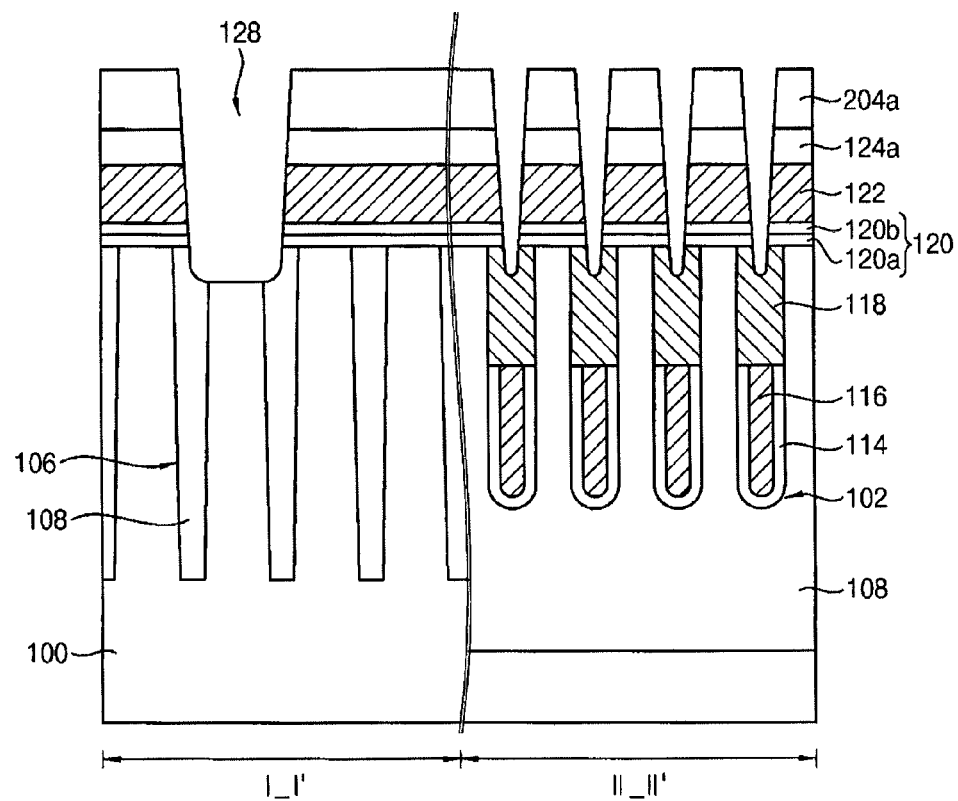

Referring to FIG. 4G, the first conductive layer 122, the etch stopping layer 120b, the pad insulating layer 120a, and the surface portion of the underlying substrate 100 may be etched by using the etching mask pattern 220 to form a first opening portion 128. Through conducting the processes, the same lower structure as illustrated in FIG. 1E may be formed.

As described above, a finally covered pattern portion may be etched to form a first preliminary opening portion 214 (see FIG. 4C), and a third mask pattern 216a may be formed by filling up the first preliminary opening portion 214 and then removing the remaining portion. In addition, a lower mask layer may be etched by using the third mask pattern 216a to form a final etching mask pattern 220. That is, the preliminary mask pattern may be formed by an intaglio method, and then a mask pattern in relief may be formed by using the preliminary mask pattern.

Then, remaining layers on the sacrificial layer may be removed, even though not illustrated. In addition, the same processes as explained referring to FIGS. 1F to 1J may be conducted to fabricate a DRAM device illustrated in FIG. 1J.

Example Embodiment 4

Figure 6A:
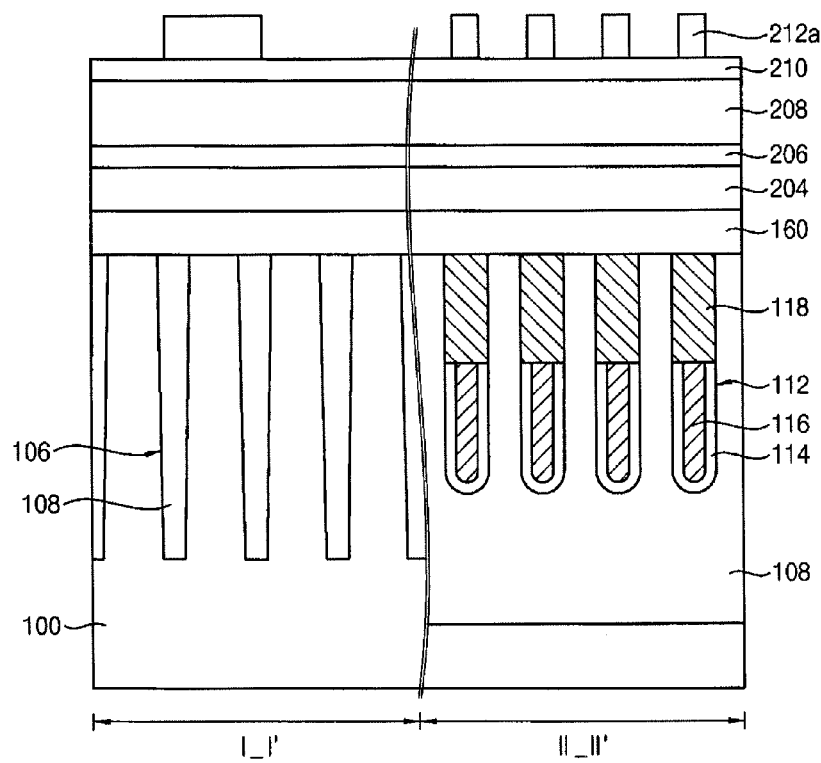
FIGS. 6A to 6C illustrate cross-sectional views of stages in a method for fabricating a semiconductor device in accordance with an exemplary embodiment.
Figure 6B:
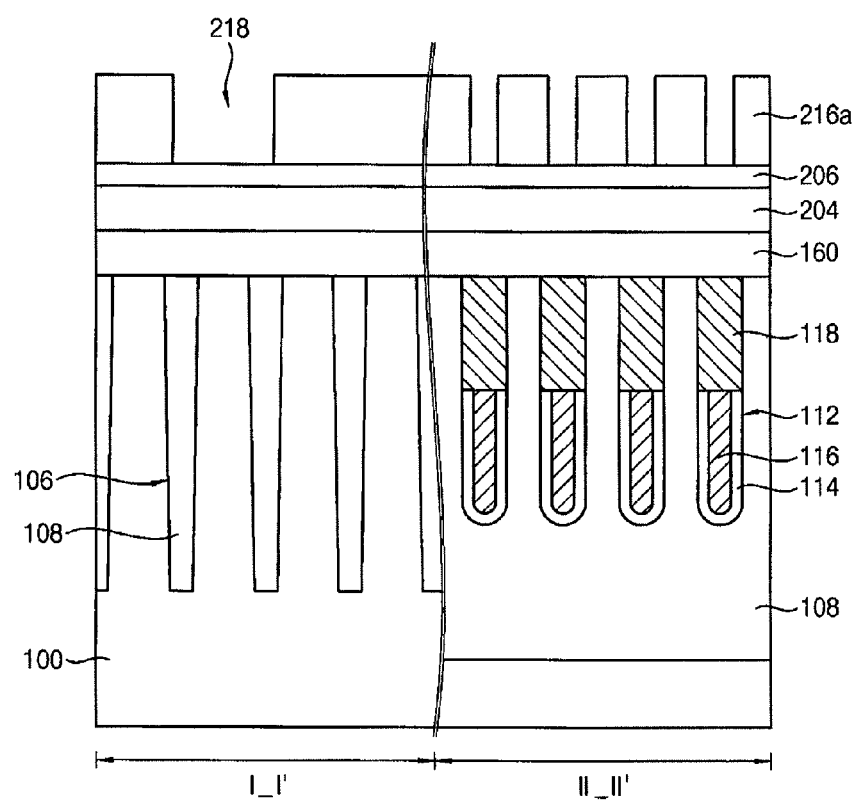
Figure 6C:
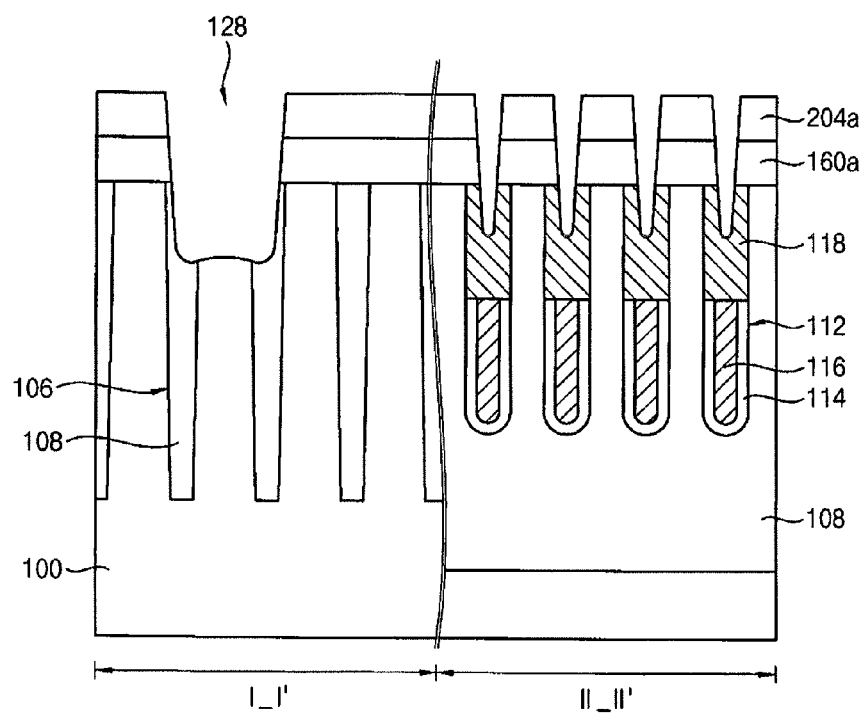

FIGS. 6A to 6C illustrate cross-sectional views of stages in a method for fabricating a semiconductor device in accordance with an exemplary embodiment.

First, the structure illustrated in FIG. 3A may be formed by conducting the same processes explained referring to FIG. 3A.

Referring to FIG. 6A, a first mask layer 204 may be formed on the insulating interlayer 160. The first mask layer 204 may include, e.g., an amorphous carbon layer.

A first anti reflecting layer 206 may be formed on the first mask layer 204. The first reflection preventing layer 206 may include, e.g., a silicon oxynitride layer. A second mask layer 208 may be formed on the first reflection preventing layer 206. The second mask layer 208 may include a spin-on hard mask layer. The spin-on hard mask layer may be, e.g., a silicon-based spin-on hard mask. A second reflection preventing layer 210 may be formed on the second mask layer 208. The second reflection preventing layer 210 may include, e.g., a silicon oxynitride layer. On the second reflection preventing layer 210, a photoresist layer may be formed.

The photoresist layer may be patterned through a photo process to form photoresist patterns 212a. The photoresist patterns 212a may have a shape exposing portions corresponding to the second and third contact forming regions 110b and 110c.

Referring to FIG. 6B, the second reflection preventing layer 210 and the second mask layer 208 may be etched by using the photoresist patterns 212a as an etching mask to form a first preliminary opening portion exposing the portions corresponding to the second and third contact forming regions 110b and 110c.

A third mask layer completely filling up the inner portion of the first preliminary opening portion and covering the upper surface of the first silicon oxynitride layer may be formed. The third mask layer may be planarized to form a third mask pattern 216a filling up the inner portion of the first preliminary opening portion. The planarization process may include a blanket etch back process or a chemical mechanical polishing process.

The second mask layer 208 between the third mask patterns 216a may be removed to form a second preliminary opening portion 218. The second preliminary opening portion 218 may correspond to a portion between the third mask patterns 216a. The second preliminary opening portion 218 may have a shape exposing the upper portions of the adjacent regions around the first contact forming region 110a and the upper portions the first contact forming region 110a. In addition, the second preliminary opening portion 218 may not have an isolated contact hole defining and exposing the first contact forming region 110a. The second preliminary opening portion 218 may have an opened shape from side to side between the third mask patterns 216a.

The processes may be substantially the same as those explained referring to FIGS. 4C to 4E.

Referring to FIG. 6C, the first reflection preventing layer and the first amorphous carbon layer may be etched by using the third mask pattern 216a as an etching mask to form an etching mask pattern.

Then, the insulating interlayer and the surface portion of the underlying substrate may be etched by using the etching mask pattern to form a first opening portion 128. Through conducting the processes, the same structure as the lower structure in FIG. 3C may be formed. Then, remaining layers on the insulating layer may be removed, even though not illustrated.

Figure 3F:
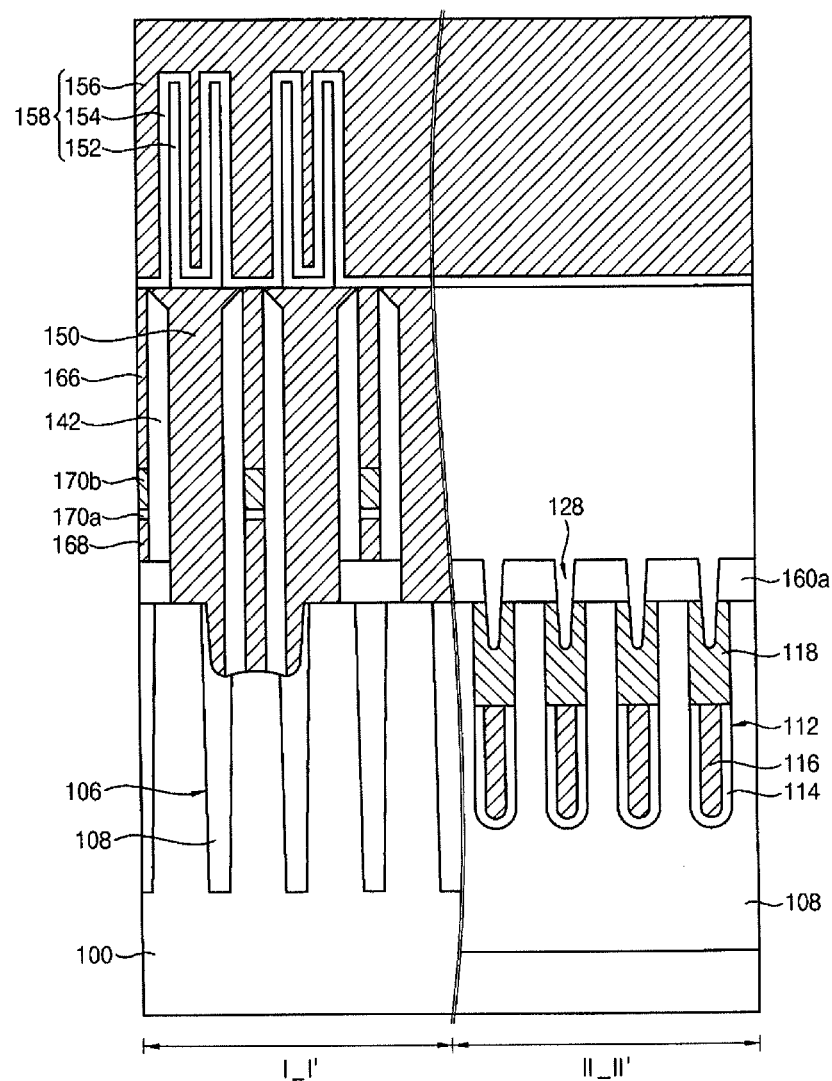

The same processes explained referring to FIGS. 3D to 4F may be conducted to fabricate a DRAM device illustrated in FIG. 3F.

The semiconductor device in accordance with example embodiments may be mounted on various types of semiconductor packages. In addition, the semiconductor device in accordance with example embodiments and the semiconductor packages including the same may be applied in various systems, e.g., a computing system.

Figure 7:
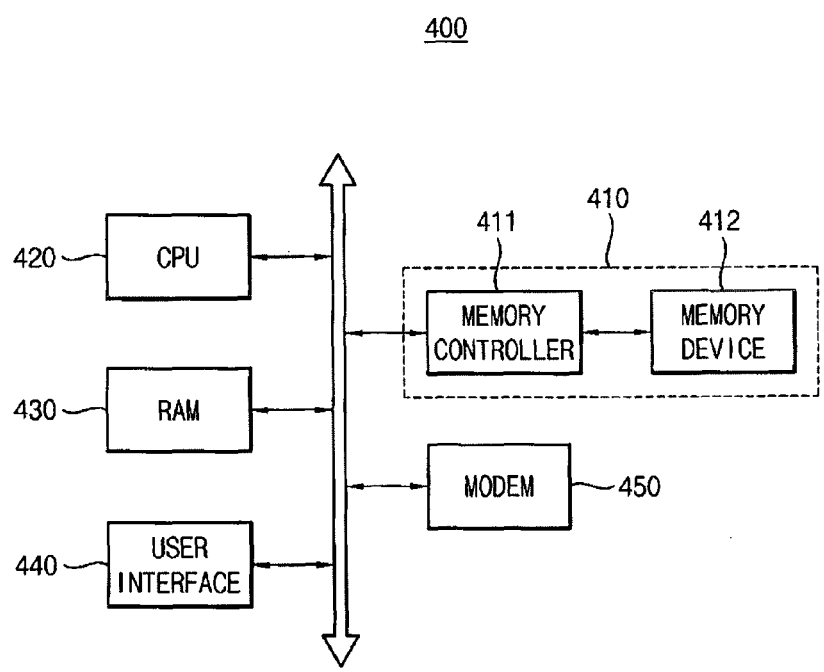

FIG. 7 illustrates a block diagram of a schematic constitution of a computing system in accordance with example embodiments.

Referring to FIG. 7, a computing system 300 may include a microprocessor (CPU) 420 making an electric connection with a system bus, a RAM 430, a user interface 440, a modem 45, e.g., a baseband chipset, and a memory system 410. The memory system 410 may include a memory device 412 and a memory controller 411. The memory device 412 may include the semiconductor device or the DRAM device in accordance with the example embodiments. The memory controller 411 may be constituted to control the memory device 412. By combining the memory device 412 and the memory controller 411, the memory system 410 may be provided as a memory card or a solid state disk (SSD). When the computing system 400 is a mobile apparatus, a battery for supplying an operation voltage of the computing system 400 may be additionally provided. The computing system 400 in accordance with example embodiments may further include, e.g., an application chipset, a camera image processor (CIS), a mobile DRAM, etc., even though not illustrated.

As described above, a semiconductor device having decreased contact resistance may be provided. The semiconductor device may be used in a memory device, e.g., a DRAM device.

According to the method for fabricating a semiconductor device, defects generated during conducting a patterning process for forming a contact may be decreased. Thus, a highly integrated semiconductor device including a minute wiring structure, e.g., having a maximum bottom contacting area and decreased neighboring bridge defects, may be fabricated.

The foregoing is illustrative of example embodiments and is not to be construed as limiting thereof. Although a few example embodiments have been described, those skilled in the art will readily appreciate that many modifications are possible in the example embodiments. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, all such modifications are intended to be included within the scope of the example embodiments as defined in the claims.

What is claimed is:

1. A method for fabricating a semiconductor device, the method comprising:
    forming a device isolation layer pattern on a substrate to form an active region having an isolated shape, the active region including a first contact forming region at an upper portion of a center portion of the active region and second and third contact forming regions at upper portions of both edge portions of the active region;
    forming an insulating layer on the substrate;
    forming a first conductive layer on the insulating layer;
    forming a mask pattern having an isolated shape on the first conductive layer, the mask pattern defining portions of the second and third contact forming regions and a portion of the device isolation layer pattern adjacent to the second and third contact forming regions;
    etching the first conductive layer and the insulating layer to expose the active region of the first contact forming region by using the mask pattern, to form a structure including a first preliminary conductive pattern and an insulating layer pattern and having a pillar shape covering the second and third contact forming regions and to form an opening portion between the structures, such that the opening portion extends to continuously overlap a plurality of active regions;
    forming a second conductive layer on the first preliminary conductive layer pattern, the second conductive layer filling up an inner portion of the opening portion; and
    patterning the second conductive layer and the first preliminary conductive layer pattern to form a wiring structure contacting the first contact forming region and having an extended line shape.

2. The method as claimed in claim 1, wherein the mask pattern is formed to have a shape covering the second contact forming region of one active region and the third contact forming region in an adjacent active region.

3. The method as claimed in claim 1, wherein the first preliminary conductive layer pattern is formed so that a minimum width of the opening portion exposing the first contact forming region is greater than a maximum width of the first contact forming region.

4. The method as claimed in claim 1, wherein the second conductive layer in the opening portion has a connected shape covering the first contact forming region, the second conductive layer excluding an isolated shape.

5. The method as claimed in claim 1, wherein a line width of the wiring structure is smaller than a minimum width of the opening portion of a portion exposing the first contact forming region.

6. The method as claimed in claim 1, wherein the substrate in the exposed active region is additionally etched so that the active region at a bottom portion of the opening portion has a lower upper surface than another active regions, during conducting an etching process with respect to the first conductive layer and the insulating layer to expose the active region of the first contact forming region.

7. The method as claimed in claim 1, wherein the mask pattern is formed as a photoresist pattern through a photo process.

8. The method as claimed in claim 1, wherein forming the mask pattern includes:
    forming a mask layer on the first conductive layer;
    forming a first preliminary mask pattern including a first preliminary opening portion selectively exposing a portion of the first contact forming region, the first preliminary mask pattern being formed on the mask layer;
    forming a buried layer burying the first preliminary opening portion of the first preliminary mask pattern;
    forming a second preliminary mask pattern including a second preliminary opening portion by removing the first preliminary mask pattern between the buried layers; and
    forming a mask pattern by etching the mask layer using the second preliminary mask pattern as an etching mask.

9. The method as claimed in claim 1, further comprising forming a buried gate structure at the substrate of the active region and the device isolation layer pattern, the buried gate structure having a line shape extended to a vertical direction of the wiring structure.

10. The method as claimed in claim 1, further comprising, after forming the wiring structure:
    forming an insulating interlayer covering the wiring structure; and
    forming a second contact and a third contact through the insulating interlayer, the second contact and the third contact contacting the active regions of the second and third contact forming regions.

11. The method as claimed in claim 1, wherein:
    the active regions extend in a first direction, the active regions being parallel to each other and spaced apart from each other in a second direction,
    the wiring structure extend the second direction, the first direction being diagonal to an extended direction of the second direction, and
    the second contact forming region of one active region is adjacent to the third contact forming region of an adjacent active region.

12. The method as claimed in claim 1, wherein forming the second conductive layer includes:

forming a polysilicon layer on the first preliminary conductive layer pattern, the polysilicon layer filling up an inner portion of the opening portion;

planarizing the polysilicon layer to form a preliminary polysilicon pattern in the inner portion of the opening portion; and forming a barrier metal layer and a metal layer on the preliminary polysilicon pattern and the first preliminary conductive layer pattern.

13. The method as claimed in claim 12, wherein forming the wiring structure by patterning the second conductive layer and the first preliminary conductive layer pattern includes:

forming a hard mask pattern on the metal layer, the hard mask pattern having a line shape; and etching the metal layer, the barrier metal layer, and the polysilicon layer by using the hard mask pattern.

14. The method as claimed in claim 12, wherein the first conductive layer includes polysilicon.

15. A method for fabricating a semiconductor device, the method comprising:

forming a device isolation layer pattern on a substrate to form an active region having an isolated shape, the active region including a first contact forming region at an upper portion of a center portion of the active region and second and third contact forming regions at upper portions of both edge portions of the active region;

forming an insulating layer on the active region;

forming a mask pattern having an isolated shape on the insulating layer, the mask pattern defining portions of the second and third contact forming regions and a portion of the device isolation layer pattern adjacent to the second and third contact forming regions;

etching the insulating layer to expose the active region of the first contact forming region by using the mask pattern, to form an insulating layer pattern having a pillar shape covering the second and third contact forming regions and to form an opening portion with a non-isolated shape between the structures;

forming a conductive layer on the insulating layer pattern, the conductive layer filling up an inner portion of the opening portion; and patterning the conductive layer to form a wiring structure making contact with the first contact forming region, the wiring structure having an extended line shape.

16. A method for fabricating a semiconductor device, the method comprising:

forming a device isolation layer pattern on a substrate to define an active region with an isolated shape, the active region including a first contact forming region at a center of the active region and second and third contact forming regions at respective edges of the active region;

forming an insulating layer on the substrate;

forming a first conductive layer on the insulating layer;

forming a mask pattern on the first conductive layer, the mask pattern defining portions of the second and third contact forming regions and a portion of the device isolation layer pattern adjacent to the second and third contact forming regions;

etching the first conductive layer and the insulating layer through the mask pattern, such that the first contact forming region in the active region is exposed through an opening and pillar structures are defined on the second and third contact forming regions of the active region, the pillar structures including a first preliminary conductive pattern and an insulating layer pattern, and the opening being defined between adjacent pillar structures;

forming a second conductive layer on the first contact forming region in the active region, such that the opening between the pillar structures is filled with the second conductive layer; and patterning the second conductive layer, such that the second conductive layer and the first preliminary conductive layer pattern have a level upper surface and define a wiring structure contacting the first contact forming region.

17. The method as claimed in claim 16, wherein forming the second conductive layer includes forming a continuous layer contacting simultaneously the first contact forming region in a plurality of active regions.

18. The method as claimed in claim 16, wherein patterning the second conductive layer includes forming the wiring structure to have a line shape, an upper surface of the line shape being continuous and contacting a plurality of active regions.

19. The method as claimed in claim 16, wherein etching the first conductive layer and the insulating layer to form the opening includes forming an opening that extends to overlap a plurality of active regions.

20. The method as claimed in claim 19, wherein the opening is not an isolated shape.

* * * * *